(12) United States Patent
Ooishi

(10) Patent No.: US 6,411,149 B1
(45) Date of Patent: *Jun. 25, 2002

(54) SEMICONDUCTOR INTEGRATED CIRCUIT DEVICE OPERABLE WITH LOW POWER CONSUMPTION AT LOW POWER SUPPLY VOLTAGE

(75) Inventor: Tsukasa Ooishi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/859,406

(22) Filed: May 20, 1997

(30) Foreign Application Priority Data

Jul. 30, 1996 (JP) .............................. 8-200035

(51) Int. Cl.[7] .............................. H03K 5/14; H03L 1/00
(52) U.S. Cl. ........................ 327/281; 327/544; 327/535; 327/262
(58) Field of Search .................. 322/530, 541, 322/544, 427, 437, 545, 546, 143, 281, 262

(56) References Cited

U.S. PATENT DOCUMENTS

| 4,859,877 | A | * | 8/1989 | Cooperman et al. .......... 326/30 |
| 5,081,380 | A | * | 1/1992 | Chen ........................... 327/541 |
| 5,355,033 | A | * | 10/1994 | Jang ............................ 327/543 |
| 5,376,840 | A | * | 12/1994 | Nakayama .................. 327/537 |
| 5,583,457 | A | * | 12/1996 | Horiguchi et al. ........... 327/544 |
| 5,717,652 | A | * | 2/1998 | Ooishi ......................... 365/233 |
| 5,731,727 | A | * | 3/1998 | Iwamoto et al. ............ 327/281 |

FOREIGN PATENT DOCUMENTS

| JP | 6-311012 | 11/1994 |
| JP | 7-086916 | 3/1995 |

OTHER PUBLICATIONS

"Circuit Design Techniques for Low–Voltage Operating and/or GIGA–Scale DRAMS" T. Yamagata et al., IEEE International Solid–State Circuits Conference 1995, pp. 248–249.

* cited by examiner

Primary Examiner—Dinh T. Le
(74) Attorney, Agent, or Firm—McDermott, Will & Emery

(57) ABSTRACT

A CMOS logic circuit is supplied with a power supply potential via current control gate transistors, and has current flowing towards ground via current control transistors. The gate potential of each current control transistor is controlled by a current control circuit. When leakage current is generated in the CMOS logic circuit, self bias to suppress leakage current is generated in the transistor forming a logic gate due to a voltage drop by the current control transistor.

28 Claims, 15 Drawing Sheets

US 6,411,149 B1

SEMICONDUCTOR INTEGRATED CIRCUIT DEVICE OPERABLE WITH LOW POWER CONSUMPTION AT LOW POWER SUPPLY VOLTAGE

BACKGROUND OF THE INVENTION

1. Field of the Invention

The present invention relates to semiconductor integrated circuit devices, and more particularly to an semiconductor integrated circuit device that allows power consumption to be reduced in a standby state.

2. Description of the Background Art

FIG. 17 is a circuit diagram showing main components of a logic gate circuit in a conventional semiconductor integrated circuit device 1000.

It is assumed that the semiconductor integrated circuit device of FIG. 17 attains a standby state.

FIG. 17 exemplifies a logic gate in which a plurality of stages of inversion circuits are connected in series.

More specifically, inverters 1010–1040 are connected in series with each other. Each inverter circuit is supplied with a voltage from a power supply potential Vcc and connected to a ground potential (GND).

It is assumed that the input to inverter circuit 1010 attains an L level (logical low) in a standby state. Therefore, the input to inverter 1020 attains an H level (logical high), the input to inverter 1030 attains an L level, and the input to inverter 1040 attains an H level in a standby state. Also, a signal of an L level is provided from inverter 1040.

Inverter 1010 includes a P channel MOS transistor 1012 and an n channel MOS transistor 1014 connected in series between power supply potential Vcc and ground potential GND. An input signal is applied to the gates of both transistors. An output node is connected to respective drain nodes of these transistors.

Here, P channel MOS transistor 1012 attains a conductive state and N channel MOS transistor 1014 attains a disconnected state in response to an input of an L level to inverter 1010.

Similarly, P channel MOS transistor 1022, N channel MOS transistor 1034, and P channel MOS transistor 1042 in inverters 1020, 1030, and 1040, respectively, attain a cut off state.

As the integration density of recent semiconductor integrated circuit devices is increased, the size of transistors is scaled down. Accordingly, the power supply voltage is reduced in order to ensure reliability of the transistors by also scaling down the intensity of the electric field applied to each transistor.

This means that the logic threshold value of a logic gate is reduced. In other words, the threshold voltage of an N channel MOS transistor, for example, must be reduced.

More specifically, reduction in the voltage of an H level causes the necessity of ensuring the operating margin of an N channel MOS transistor to be cut off when a potential of an L level, for example, is applied to the gate.

However, this also induces degradation of the subthreshold characteristics of the N channel MOS transistor. A lower threshold voltage induces the problem that the leakage current of the N channel MOS transistor is increased when the gate potential thereof attains an L level.

The same can be said for a P channel MOS transistor.

FIGS. 18A and 18B are diagrams for describing the mechanism of leakage current increase in an N channel MOS transistor. FIG. 18A schematically shows the potential level of each element in a standby state where two inverters are connected in series. FIG. 18B shows the change in source-drain current with respect to gate voltage.

FIG. 18A shows only the first two stages of the inverter row shown in FIG. 17.

As described above, the input node of inverter 1010, i.e. the gate potential of N channel MOS transistor 1014, attains an L level in a standby state.

FIG. 18B shows the three cases where the threshold voltage is VT1, VT2, and 0V (VT1>VT2>0V).

When the power supply voltage is, for example, 5V, a sufficient operating margin can be ensured even when the threshold voltage is VT1. Here, the source-drain current is its threshold leakage current Iso when gate voltage is 0V in order to render N channel MOS transistor 1014 non-conductive.

If the threshold voltage is lowered to the level of VT2 in order to ensure an operating margin when the power supply voltage is, for example, 3V, the leakage current of N channel MOS transistor 1014 attaining a cut off state increases. More specifically, the subthreshold leakage current when the gate potential is 0V increases from Iso to Is1.

The leakage current of the entire circuitry increases when the threshold voltage is lowered in order to operate at low voltage by decreasing the amount of impurity ions implanted into the channel region of a transistor.

In other words, there was a problem that the power consumption of an semiconductor integrated circuit device in a standby state is increased.

SUMMARY OF THE INVENTION

An object of the present invention is to provide an semiconductor integrated circuit device that does not have leakage current increased even when operated at a low power supply voltage, i.e. that does not have power consumption increased.

According to an aspect of the present invention, an semiconductor integrated circuit device includes an internal circuit, a first power source, a second power source, a plurality of first stage current control circuits, a plurality of second stage current control circuits, and an operating current control circuit.

The internal circuit includes a plurality of logic gates. The first power source supplies a first power supply potential corresponding to a first level of data processed by the internal circuit to a first power supply node. The second power source supplies a second power supply potential corresponding to a second level of data to a second power supply node. Each of the plurality of first stage current control circuits is provided between the logic gate and the first power supply node for controlling the amount of current flow from the first power source. Each of the plurality of second stage current control circuits is provided between the logic gate and the second power supply node for controlling the amount of current flow to the second power supply. The operating current control circuit controls the first and second stage current control circuits in response to the internal circuit attaining a standby state or an active state.

According to another aspect of the present invention, an semiconductor integrated circuit device includes an internal circuit, a first power source, a second power source, a plurality of stage current control circuits, and an operating current control circuit.

The internal circuit includes a plurality of CMOS control gates. The first power source supplies a first power supply potential corresponding to a first level of data processed by the internal circuit to a first power supply node. The second power source supplies a second power supply potential corresponding to a second level of data to a second power supply node. Each of the plurality of stage current control circuits is provided corresponding to the logic gate for controlling an amount of current flowing between one of the first power supply node and the second power supply node that is to be cut off from the output node of a corresponding logic gate according to a predetermined input signal level in a standby state and a corresponding logic gate. The operating current control circuit controls the stage current control circuit in response to the internal circuit attaining a standby state or an active state.

According to a further aspect of the present invention, an semiconductor integrated circuit device includes a plurality of internal circuit blocks, a control circuit, a first power source, a second power source, a plurality of first stage current control circuits, a plurality of second stage current control circuits, an operating current control circuit, a first switch circuit, and a second switch circuit.

The plurality of internal circuit blocks include a plurality of logic gates. The control circuit controls the operating timing of each internal circuit block. The first power source supplies a first power supply potential corresponding to a first level of data processed by the internal circuits. The second power supply supplies a second power supply potential corresponding to a second level of data. Each of the plurality of first stage current control circuits is provided corresponding to the CMOS logic circuit for controlling an amount of current flow from the first power source. Each of the plurality of second state current control circuits is provided corresponding to the logic gate for controlling an amount of current flow towards the second power source. The operating current control circuit controls the first and second stage current control circuits in response to the plurality of internal circuit blocks attaining a standby state or an active state. The first switch circuit is provided between the first power source and the plurality of first stage current control circuits for each internal circuit block, and controlled by the control circuit to be rendered conductive during an operating period of the internal circuit. The second switch circuit is provided between the second power source and the plurality of second state current control circuits for each internal circuit block, and controlled by the control circuit to be rendered conductive during an operating period of the internal circuit.

Thus, a main advantage of the present invention is that a self bias is applied to the transistor forming the logic gate in a direction where leakage current is reduced when there is a flow of leakage current via the logic gate during a standby period. Even when the threshold value of the transistor forming the logic gate is lowered in accordance with reduction in the power supply potential, power consumption of the logic gate in a standby state can be reduced.

Another advantage of the present invention is that the stage current control circuit is disposed at either the ground potential side or the power potential side according to the input signal of each logic gate attaining a predetermined level in the standby state. The number of the stage current control circuits can be suppressed to allow reduction in the layout area.

A further advantage of the present invention is that power consumption can further be reduced since operating current is supplied only to the logic gate circuit of the internal circuit attaining an active state out of the plurality of internal circuit blocks.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
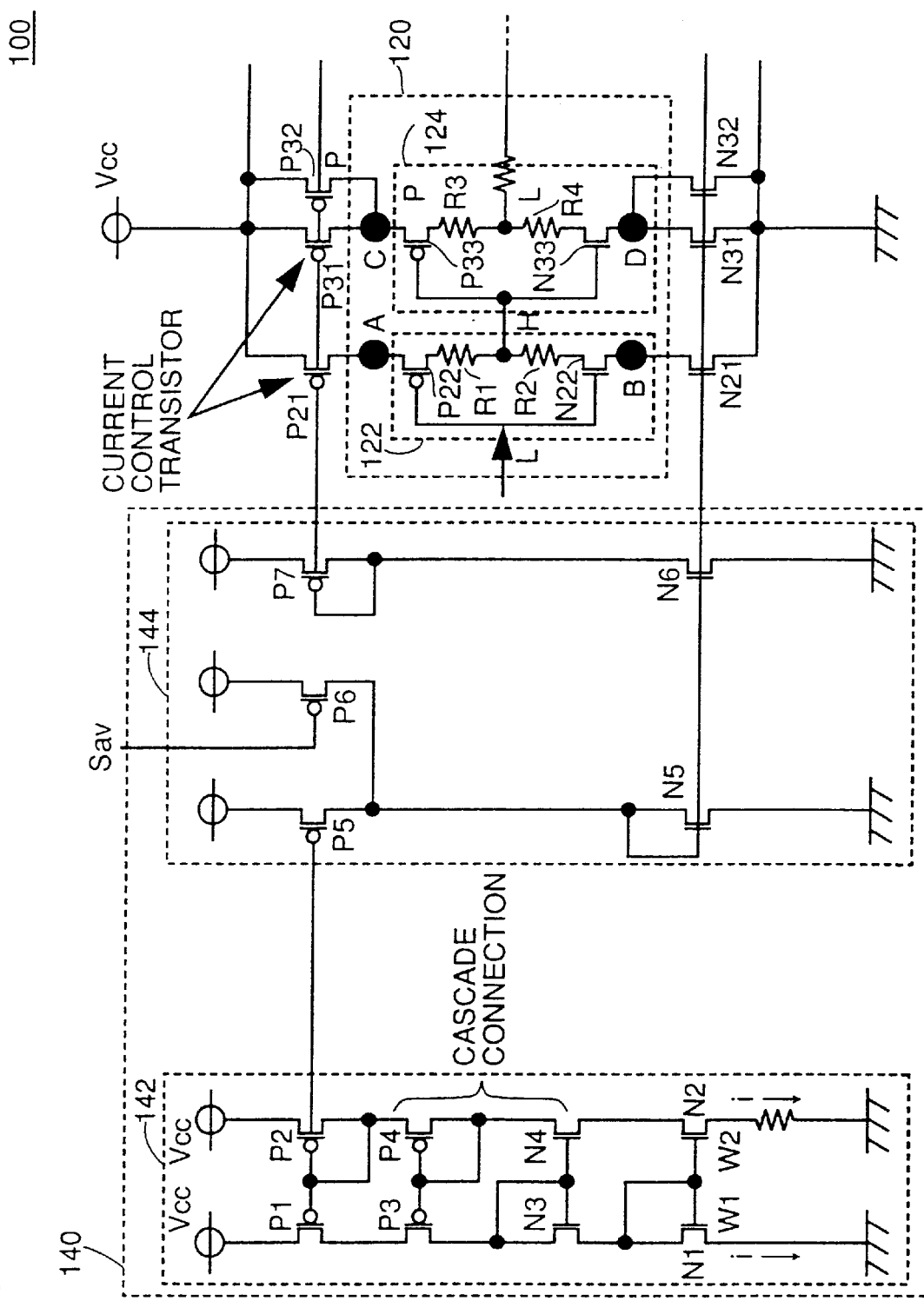
FIG. 1 is a circuit diagram showing a structure of an semiconductor integrated circuit device according to a first embodiment of the present invention.

An semiconductor integrated circuit device 100 according to a first embodiment of the present invention is shown in FIG. 1.

Figure 17:
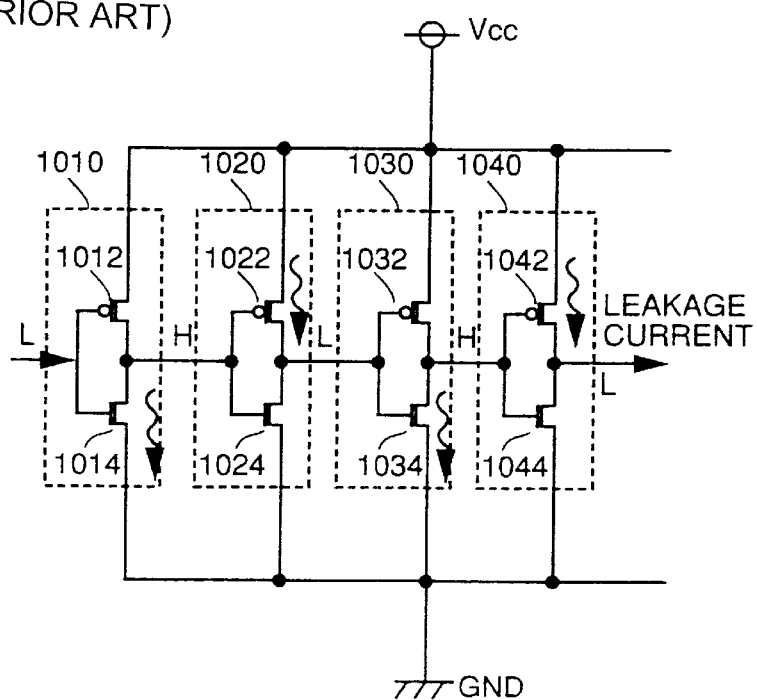
FIG. 17 is a circuit diagram showing main components of a conventional semiconductor integrated circuit device 1000.

Difference in structure of semiconductor integrated circuit device 100 of FIG. 1 from conventional semiconductor integrated circuit device 1000 of FIG. 17 is set forth in the following.

Each logic gate in a CMOS logic circuit 120 is supplied with a power supply potential Vcc via a P channel MOS transistor which is a transistor for current control, and connected to ground potential GND via an N channel MOS transistor which is a transistor for current control.

A current control circuit 140 is provided to control the amount of current flowing through the aforementioned current control P channel MOS transistor and N channel MOS transistor.

In each logic gate of CMOS logic circuit 120, the drain node of the P channel MOS transistor or the N channel MOS transistor in the logic gate is connected to an output node via a resistor in order to further increase the leakage current reducing effect in a standby state.

Under control of an activation signal Sav, the current supplied to CMOS logic circuit 120 is suppressed during a standby period than during an active period of activation signal Sav.

Details of the above-described structure will be provided hereinafter.

Although an inverter is taken as an example for a logic gate included in CMOS logic circuit 120 in the following description, a similar structure can be established for other logic gate circuits, for example, a NAND circuit or a NOR circuit.

Furthermore, the above "logic gate circuit" can include not only a single gate such as a NAND gate but also more composite circuit such as a compound gate and a circuit having serially connected inverters.

CMOS logic circuit 120 includes inverter circuits 122 and 124.

Inverter 122 includes a P channel MOS transistor P22 supplied with power supply potential Vcc at its source via a P channel MOS transistor P21, a resistor R1 connected between the drain of P channel MOS transistor P22 and an output node, an N channel MOS transistor 22 having its source coupled to ground potential GND via N channel MOS transistor N21, and a resistor R2 connected between a drain of N channel MOS transistor N22 and the output node. P channel MOS transistor P22 and N channel MOS transistor N22 have their gates connected to the input node.

Inverter 124 has a structure similar to that of inverter 122. Power supply potential Vcc is supplied via P channel MOS transistors P31 and P32. Inverter 124 is coupled to ground potential GND via N channel MOS transistors N31 and N32.

In order to control the power supply current supplied to one logic gate, the current control transistors per one stage of the logic gate (referred to as per one stage hereinafter) can be implemented using one P channel MOS transistor and one N channel MOS transistor as in inverter 122, or using two or more of respective P channel MOS transistors and N channel MOS transistors as in inverter 124. The control effect of leakage current can be adjusted according to the number of current control transistors used per one stage.

Current control circuit 140 includes a constant current generation unit 142 and a gate potential control unit 144.

Constant current generation unit 142 includes N channel MOS transistors N1 and N2 forming a current mirror circuit with each other, and a resistor RS connected between the source of N channel MOS transistor N2 and the ground potential node.

Here, it is assumed that the gate width of N channel MOS transistor N1 is W1, and the gate width of N channel MOS transistor N2 is W2.

By adjusting the gate width of N channel MOS transistors N1 and N2, a structure can be implemented in which these two transistors both operate in a weak inversion region.

Considering that a current flowing through an N channel MOS transistor increases in an exponential functional manner with respect to gate-source voltage Vgs and is proportional to the gate width, the current i flowing through N channel MOS transistors N1 and N2 is expressed as below:

$$i = W1 \exp[Vgs1/S] \quad (1)$$

$$i = W2 \exp[Vgs2/S] \quad (2)$$

where the gate-source voltage of N channel MOS transistor N1 is Vgs1, the gate-source voltage of N channel MOS transistor N2 is Vgs2, and the so-called subthreshold coefficient is S, and the coefficient with respect to the gate-source voltage in the exponential function is 1/S.

Obtaining ΔVgs1–Vgs2 from the above equations (1) and (2) results in:

$$\Delta V S \times \ln[W2/W1] \quad (3)$$

Since subthreshold coefficient S is proportional to kT/q (k:Boltzman coefficient; T: absolute temperature; q: unit charge amount), ΔV also is proportional to the absolute temperature.

However, ΔV is determined only by the ratio of the gate width of the transistors, and does not depend upon the operating point of a transistor.

Therefore, the value of current i is represented as i =ΔV/Rs, and dependency on power supply potential Vcc is extremely small.

Constant current generation unit 142 further includes a pair of P channel MOS transistors P1 and P2 forming a current mirror circuit, and having their sources coupled to power supply potential Vcc, and two cascade-connected current mirror circuits between the current mirror circuit constituted by P channel MOS transistors P1 and P2 and the current mirror circuit constituted by N channel MOS transistors N1 and N2. More specifically, a first current mirror circuit formed of P channel MOS transistors P3 and P4, and a second current mirror circuit formed of N channel MOS transistors N3 and N4 are arranged in a cascade-connected manner.

The cascade-connected current mirror circuit serves to relieve the channel length modulation effect of the transistors forming constant current generation unit 142 and suppresses the power supply potential dependency of the generated current.

In a standby state, P channel MOS transistor P6 attains a non-conductive since activation signal Sav applied thereto attains an H level.

The gate potential of transistor P5 is controlled so that a current identical to constant current i generated at constant current generation unit 142 flows to P channel MOS transistor P5 of gate potential control unit 144. In response, current i also flows to N channel MOS transistor N5. Therefore, current i also flows to N channel MOS transistor N6 forming a current mirror circuit with this transistor N5. Similarly, a current i equal to that of transistor N6 also flows to P channel MOS transistor P7.

The gate potentials of P channel MOS transistors P21, P31, and P32 which are current control transistors are maintained so as to be equal to each other. The gate potentials of N channel MOS transistors N22, N31 and N32 are controlled to be equal to the gate potential of transistor N6.

Therefore, current i will flow to each of current control transistors P21, P31, P32, N22, N31 and N32 in a standby state when the gate width thereof are equal to each other.

When activation signal Sav is driven to an L level to designate activation of circuitry operation, the amount of current flowing through N channel MOS transistor N5 increases. In response, the current flowing through transistors N6 and P7 also increases. This causes increase in the current flowing through current control transistors P21, P31, P32, N22, N31, and N32, so that the current supplied to CMOS logic circuit 120 in an activation mode increases.

Figure 2:
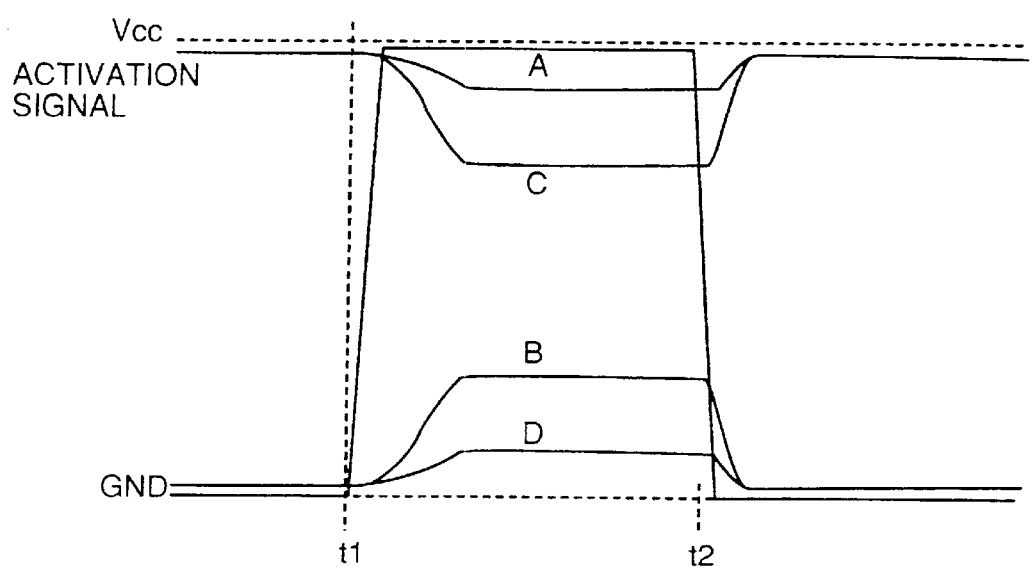
FIG. 2 is a timing chart for describing an operation of an semiconductor integrated circuit device 100.

FIG. 2 is a timing chart showing the potential level of each node of CMOS logic circuit 120 over time.

The source node of P channel MOS transistor P22 is designated A, the source node of N channel MOS transistor N21 is designated B, the source node of P channel MOS transistor P33 is designated C, and the source node of N channel MOS transistor N33 is designated D.

It is assumed that the input level to inverter 122 is an H level in a standby state.

At time t1 when activation signal Sav is driven to an H level, semiconductor integrated circuit device 100 enters a standby state. Here, N channel MOS transistor N21 attains an cut off state in response to the input of inverter 122 attaining an L level, and P channel MOS transistor P33 attains a cut off state in response to the input into inverter 124 attaining an H level.

As described above, the current supplied to inverter 122 is limited to the level of current value i by current control transistors P21 and N22.

Consider a case where there is leakage current in N channel MOS transistor N21 that should attain a cut off state. The potential of node B increases as a leakage current is generated. This means that the gate potential of N channel MOS transistor N21 is biased relatively negative with respect to the source potential (potential of node B). Therefore, the leakage current flowing through N channel MOS transistor N21 is suppressed. When a leakage current begins to flow, the gate potential of each transistor is biased negatively in a self-matching manner. As a result, the leakage current is reduced. Increase of leakage current in a standby state is suppressed even when the threshold voltage of the transistor forming CMOS logic circuit 120 is reduced.

The same applies to inverter 124 having an input node of an H level in a standby state. More specifically, P channel MOS transistor P33 attains a cut off state in a standby mode in inverter 124. When leakage current is generated in transistor P33, the potential level of node C decreases corresponding to the voltage drop by transistor P31 from power supply potential Vcc. The gate of P channel MOS transistor P33 is biased relatively towards the positive side, whereby leakage current decreases.

According to the structure of inverter 124 having two current control transistors disposed at both the power source side and the ground side, the current supplied in a standby mode or in an operating state can be increased than that of inverter 122.

At time t2 when activation signal Sav attains an active state of an L level, the amount of current flowing to current control transistors P21, P31, P32 and current control transistors N22, N31, N32 increases. Therefore, a sufficient amount of operating current is supplied to CMOS logic circuit 120 in an operating state, so that each logic gate can operate at high speed.

Figure 3A:
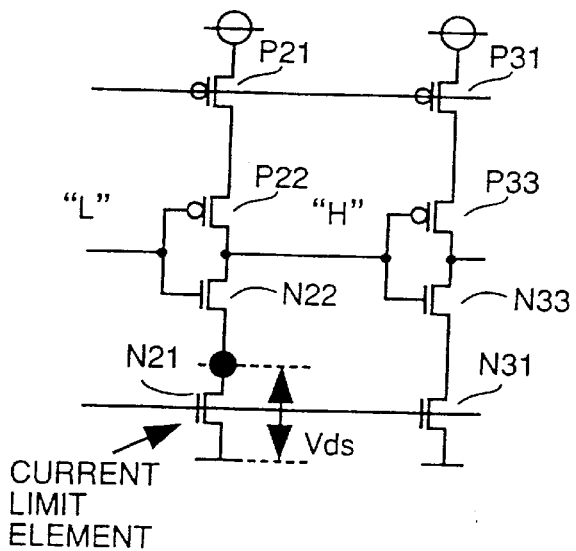
FIG. 3A is a circuit diagram showing main components of semiconductor integrated circuit device 100.
Figure 3B:
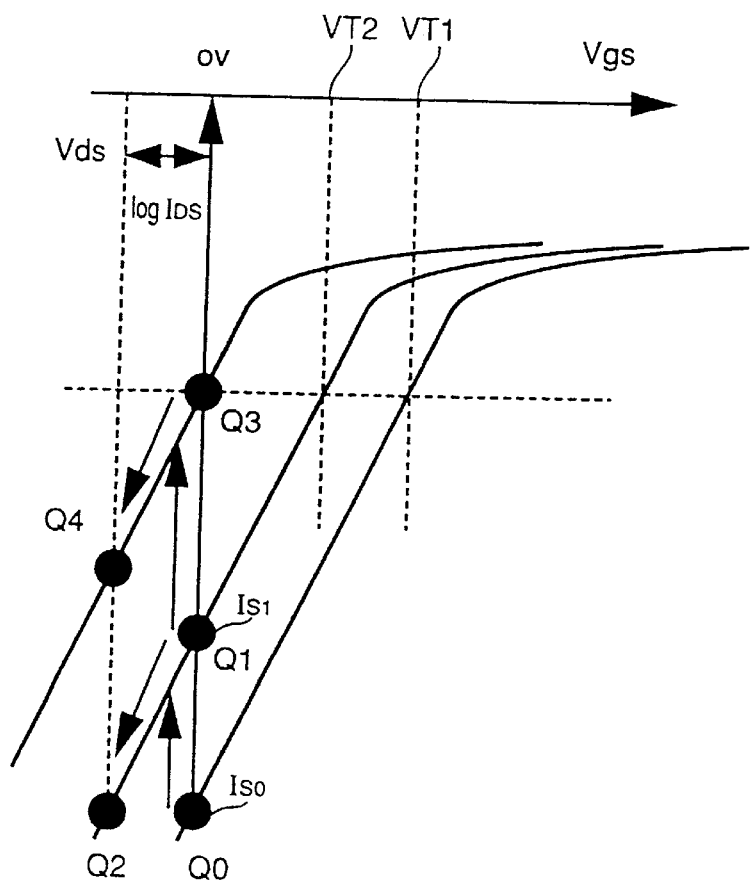
FIG. 3B is a diagram showing the operating point of a transistor in occurrence of leakage current for describing the operation of semiconductor integrated circuit device 100 in leakage current reduction.

FIG. 3A is a circuit diagram showing the main components of CMOS logic circuit 120. FIG. 3B is a semi-log plot showing the relationship of gate-source voltage Vgs and source-drain current Ids of N channel MOS transistor N21.

As described with reference to FIGS. 1 and 2, N channel MOS transistor N21 attains a cut off state, i.e. a state where a potential of 0V is applied to the gate in a standby state.

Here, a case is considered where the threshold value of N channel MOS transistor N21 is VT1. When gate potential Vgs is 0V, the value of leakage current is Is0.

In accordance with reduction of power supply potential Vcc, the value of the leakage current increases as high as Is1 when the gate potential is 0V with the threshold value of VT2.

However, as described with reference to FIG. 1, a relatively negative bias with respect to the source is applied to the gate of N channel MOS transistor N21 at occurrence of a leakage current.

Referring to FIG. 3B, the operating point of N channel MOS transistor N22 shows a transition from Q1 to Q2. Therefore, the value of the leakage current is reduced to a level equal to that when the threshold voltage is VT1.

Furthermore, considering that the gate potential is biased negatively according to a leakage current, the operating point is shifted to Q4 in a standby state, resulting in reduction of the leakage current even when the threshold voltage is 0V and 0V is applied to the gate (operating point Q3).

Thus, the semiconductor integrated circuit device of the present invention can have leakage current reduced in a standby state even in the case where the threshold voltage is an extremely low level such as 0V.

This means that the leakage current can be suppressed even when the power supply voltage is further reduced, for example to less than 3V.

Figure 4:
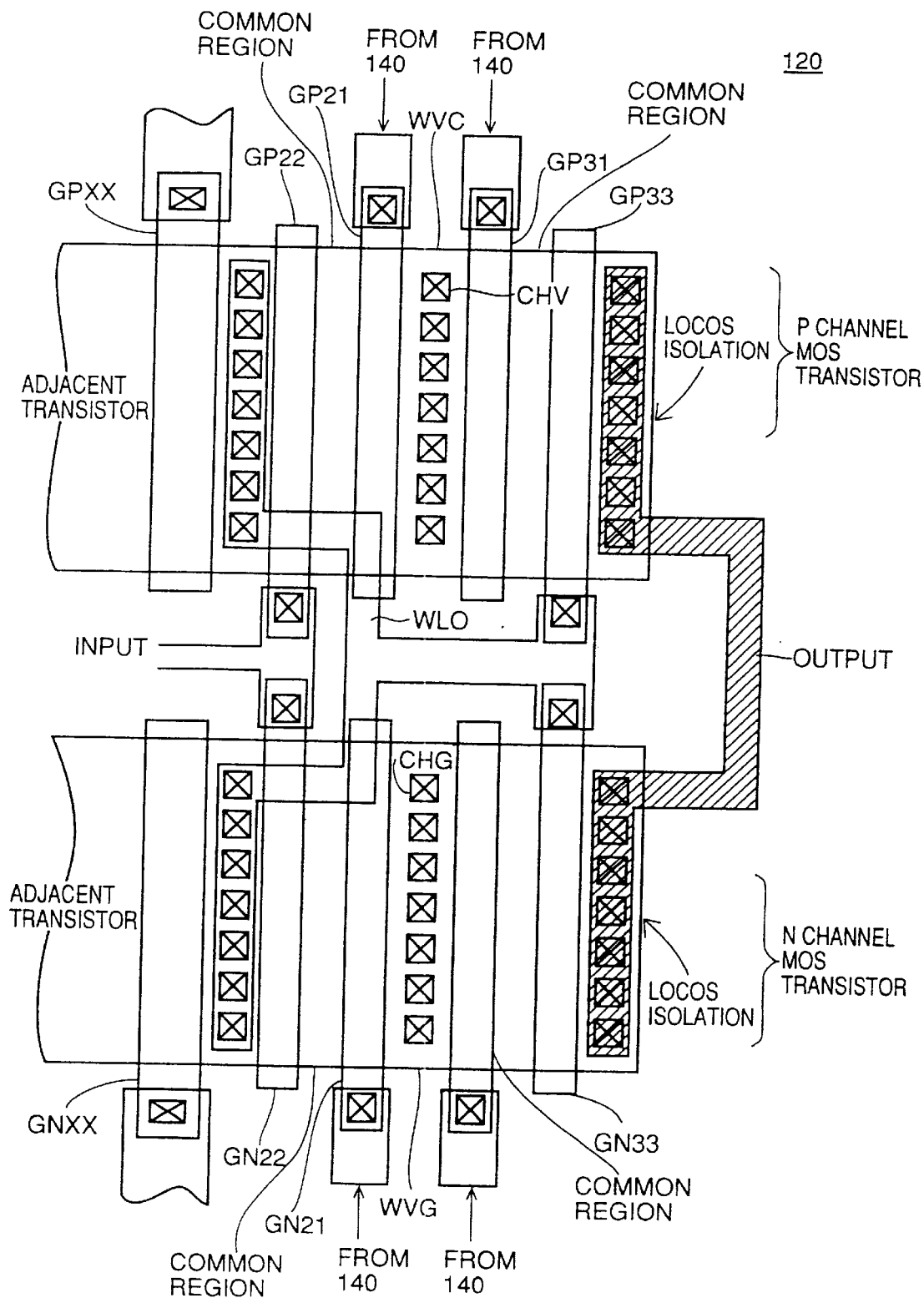
FIG. 4 shows a layout pattern of components of semiconductor integrated circuit device 100.

FIG. 4 is a layout diagram of the plane pattern of the inverter 122 portion of FIG. 1.

The layout area of circuitry will be increased if current control transistors P21 and N21 are laid out in a different region from transistors P22 and N22 forming inverter 122. By providing a structure in which the current control transistor and the transistor forming the logic circuit share their source and drain regions as shown in FIG. 4, increase of the layout area can be suppressed.

In FIG. 4, P channel MOS transistor P32 and N channel MOS transistor N32 shown in FIG. 1 are not shown for the shake of simplification.

It is assumed that power supply potential is supplied by an interconnection pattern WVC, and the ground potential is supplied through an interconnection pattern WVG. Interconnection WVC is connected to the sources of P channel MOS transistors P21 and P31 via a contact hole CHV. Potential from current control circuit 140 is applied to a gate interconnection GP21 forming the gate of transistor P21. P channel MOS transistor P21 and transistor P22 have a common drain region. A gate interconnection GP22 of transistor P22 is disposed opposite to gate interconnection GP21 sandwiching this common region. Interconnection WLO is connected to the drain region opposite to the common region with respect to gate interconnection GP22. More specifically, the output of inverter 122 is transmitted by interconnection WLO.

Similarly, an interconnection WVG is connected to the source region of transistor N21 via contact hole CHG. The area opposite to the source region with respect to gate interconnection GN21 of N channel MOS transistor N21 is the common region of the source region of N channel MOS transistor N22 and the drain region of N channel MOS transistor N21.

The area opposite to the common region with respect to gate interconnection GN22 of N channel MOS transistor N22 is the drain region of N channel MOS transistor N22. Interconnection WL0 is connected to this drain region.

Similarly, P channel MOS transistor P31 and P channel MOS transistor P33 have a drain region and a source region of a common area. Also, N channel MOS transistor N31 and N channel MOS transistor N33 have a common region for its drain region and source region, respectively.

Since a structure is implemented in which four transistors share source and drain regions, increase in the layout area is suppressed.

In the example shown in FIG. 4, the integration density is improved by using a structure set forth in the following as a transistor isolation structure.

Since P channel transistor P33 is located at the end of the region where the transistor is laid out, the end of the drain region of transistor P33 connected to interconnection WL1 that becomes the output node attains the so-called locos isolation.

A gate GPXX for isolation is disposed between transistor P22 and an adjacent transistor. The leakage current across the transistors is suppressed by applying a potential of the power supply potential level or a higher level to the isolation gate.

Therefore, the layout area is reduced since only the gate region of this isolation transistor GPXX is required as an element isolation region.

N channel transistors N33 and N22 have a similar structure. More specifically, an isolation gate GNXX is disposed between transistor N22 and an adjacent transistor. Leakage current across the transistors is suppressed by applying a potential of the ground potential level or a lower level to isolation gate GNXX.

The constant current generation unit of FIG. 1 has a structure wherein the value of the generated constant current is determined according to the current driving capability ratio of N channel MOS transistor N1 to N2 (ratio of gate width). The threshold value of these transistors does not have to be controlled in order to adjust the value of a generated constant current.

Therefore, the threshold value of transistors N1 and N2 can be set to an extremely low value even when the power supply voltage is reduced. In an extreme occasion, the threshold value of these transistors can be set to 0V or to a negative value. In other words, depletion type transistors can be adopted as transistors N1 and N2.

Similarly, depletion type transistors can also be adopted as P channel MOS transistors P1 and P2 at the power supply side in an extreme occasion since the threshold values thereof should only be set to supply equal current to left side and right side transistors.

Furthermore, P channel MOS transistors P3 and P4 and N channel MOS transistors N3 and N4 included in the two cascade-connected current mirror circuits form circuitry directed to operate each left side and right side arranged transistors at a saturated region under sufficient control and suppress effect in channel length variation. It is therefore possible to set the threshold value of these transistors to a low level according to reduction in the power supply voltage. Thus, the constant current generation circuit per se can be operated at a low power supply voltage of not more than 0.5V, for example.

Figure 5:
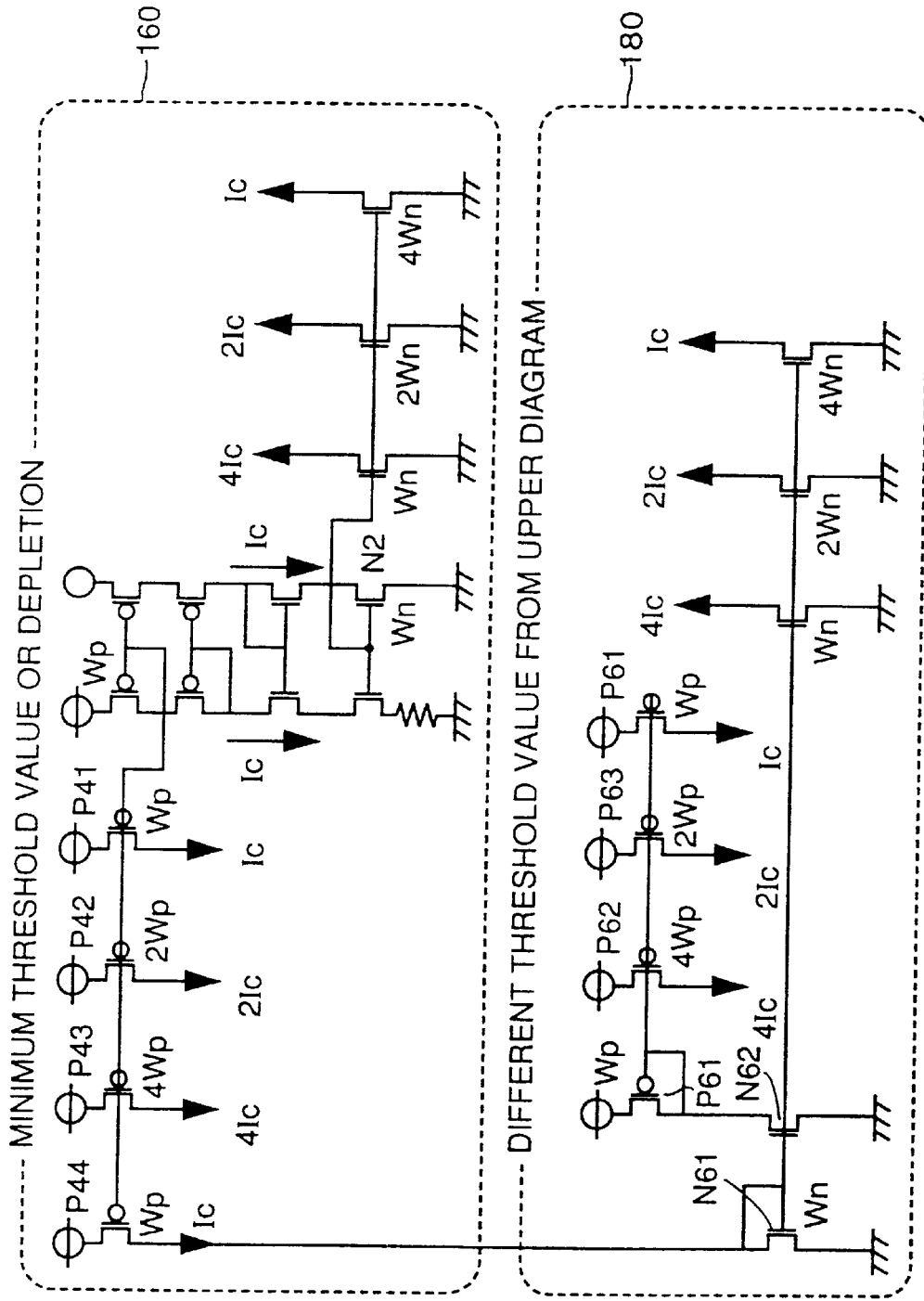
FIG. 5 is a circuit diagram showing an example of a structure of a constant current control circuit 140 and a stage current control transistor.

FIG. 5 shows a method of adjusting the current supplied to each logic gate by a constant current generation unit when the threshold value of each transistor of the constant current generation unit is set to a low value.

It is assumed that a constant current Ic flows to constant current generation unit 142 in FIG. 5. P channel MOS transistor P1 has a gate width of Wp and N channel MOS transistor N2 has a gate width of Wn.

Here, the supply current can be controlled across transistors having a threshold value equal to that of the transistors forming constant current generating unit 142 directly by the gate potential of transistor P1 or N2 of constant current generation unit 142.

It is assumed that the transistors in region 160 have the same threshold value, and the transistors in region 180 have different threshold values in FIG. 5. Furthermore, it is assumed that the threshold value of the transistors in region 160 to which constant current generation unit 142 belongs is set to a value so as to form a depletion type transistor. Therefore, the transistors in region 160 can operate by an extremely low power supply voltage.

In order to set the current supplied from the power source side to a predetermined constant current level, control is required so that the gate potentials of P channel MOS transistors, P41, P42 and P43, which are current control transistors, equal to that of transistor P1. Here, when the value of the current supplied from each transistor must be altered, a double constant current Ic and a quadruple constant current can be supplied if the gate width of transistors P42 and P43 are set to 2×Wp and 4×Wp, respectively.

The same applies for current control transistors N41, N42 and N43 connected to the ground side.

In the case of region 180 in which the threshold value of the transistors differ from the threshold value of the transistors in region 160, a structure is implemented in which current is supplied to a current mirror circuit formed of N channel MOS transistors N61 and N62 belonging to region 180 via P channel MOS transistor P44 controlled to have a gate potential equal to that of transistor P1.

In order to adjust the value of current supplied from the power source side, a structure is provided using a transistor P61 connected between the drain of N channel MOS transistor N62 and power supply potential Vcc. More specifically, the gate potentials of current control transistors P62, P63 and P64 with respect to the CMOS logic circuit belonging to region 180 are maintained equal to the gate potential of transistor P61, and a current mirror circuit is formed by these transistors.

As described above, the leakage current of the CMOS logic circuit in a standby mode can be reduced even when the power supply voltage is lowered in integrated semiconductor circuit 100 according to the first embodiment. Since a structure is provided in which sufficient current can be supplied in an operating period, high speed, low current at standby, and operation at low power supply voltage can be achieved.

Second Embodiment

Figure 6:
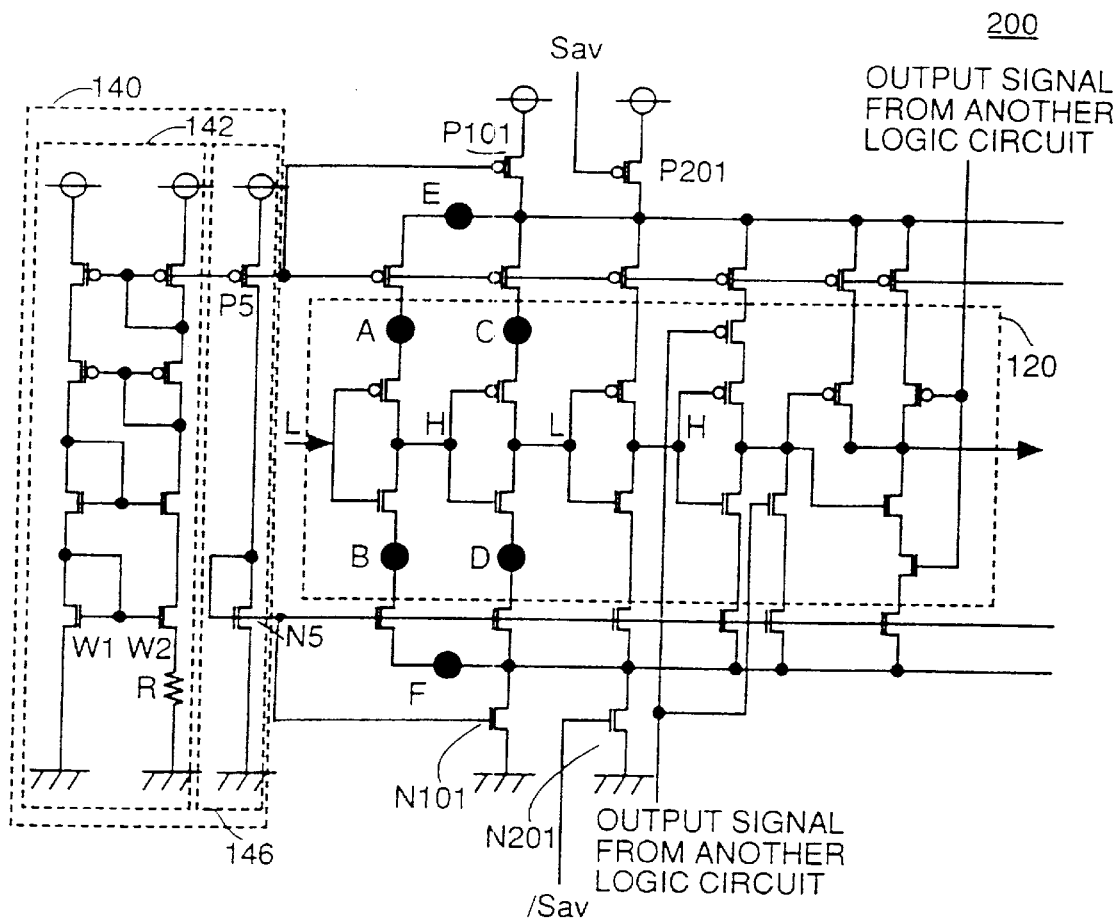
FIG. 6 is a circuit diagram showing main components of an semiconductor integrated circuit device 200 according to a second embodiment of the present invention.

FIG. 6 is a circuit diagram showing main components of an semiconductor integrated circuit device 200 according to a second embodiment of the present invention.

The structure of semiconductor integrated circuit device 200 differs from the structure of semiconductor integrated circuit device 100 of the first embodiment in the following points.

Firstly, semiconductor integrated circuit device 200 of the second embodiment has its source of the current control transistor of the CMOS logic circuit coupled, not directly to power supply potential Vcc or ground potential GND, but via transistor P101 or N101.

More specifically, P channel MOS transistors P21 and P31 which are transistors that control the current supplied from the power source have their sources connected to common node E, and P channel MOS transistor P101 is connected between common node E and power supply potential Vcc. The gate potential of transistor P101 is controlled to achieve a potential level identical to those of current control P channel MOS transistors P21 and P31.

N channel MOS transistors N21 and N31 controlling the value of current flow towards ground has their sources connected to common node F. N channel MOS transistor N101 is connected between this common node F and ground potential GND. The gate potential of transistor N101 is controlled to achieve a level identical to those of transistors N21 and N31.

In the following description, transistors P21 and N21 disposed with respect to each logic gate are referred to as stage current control transistors, and transistors N101 and P101 provided corresponding to CMOS logic circuit 120 are referred to as block current control transistors.

In semiconductor integrated circuit device 200 of the second embodiment, transistors controlling the value of the current supplied to CMOS logic circuit 120 have a hierarchical structure.

Secondly, a P channel MOS transistor P201 is connected between common node E and power supply potential Vcc, having its gate potential controlled by activation signal Sav. An N channel MOS transistor 201 is connected between common node F and ground potential GND, having its gate potential controlled by activation signal/Sav.

Transistors P201 and S201 both attain a conductive state when the internal circuit is active, i.e. when activation signal Sav attains an active state (L level) due to signal/Sav attaining an H level.

Thirdly, stage current control transistors such as transistors P21, P31, N21, N31 and block current control transistors such as transistors P101 and N101 have their gate potential directly controlled by a gate potential control unit 146 shown in FIG. 6.

More specifically, control is provided so that the gate potential of transistor P5 in gate potential control unit 146 having a structure similar to that of gate potential control unit 144 in FIG. 1 except that transistors P6, N6 and N7 are removed is equal to the gate potential of the stage current control transistors and block current control transistors disposed at the power source side such as transistors P21, P31 and P101.

Also, control is provided so that the gate potential of the stage current control transistors and the block current control transistors disposed at the ground side such as transistors N21, N31 and N101 is equal to the gate potential of transistor N5 of gate potential control unit 146.

Figure 7:
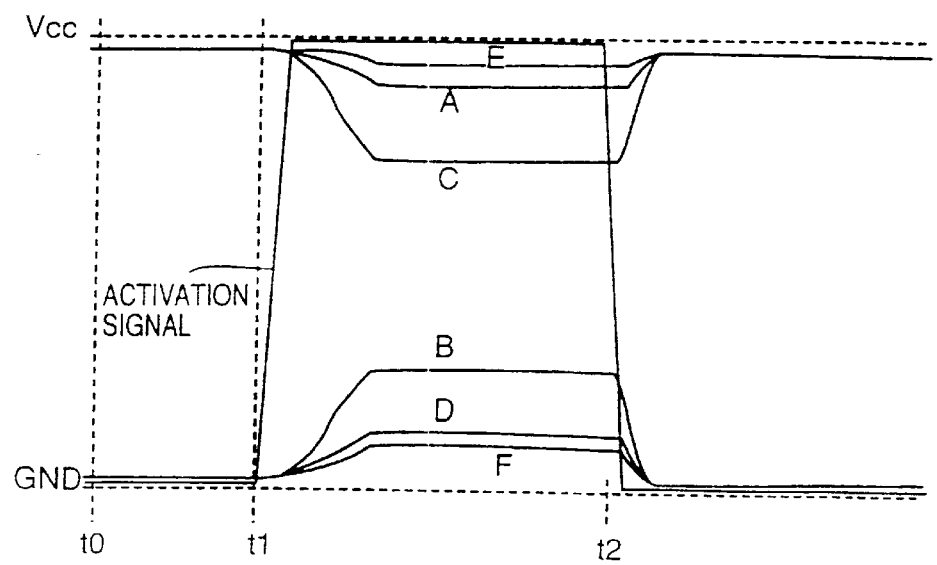
FIG. 7 is a timing chart for describing an operation of semiconductor integrated circuit device 200.

FIG. 7 is a timing chart for describing the operation of semiconductor integrated circuit device 200 of the second embodiment.

In an active period from time t0 to time t1, signal Sav attains an L level, and transistors P201 and N201 attain a conductive state.

Therefore, the value of the current supplied to each logic gate in CMOS logic circuit 120 is controlled by a stage current control transistor independent of the presence of transistors P101 and N101.

In semiconductor integrated circuit device 200 of the second embodiment, the value of the current supplied from the constant current generation unit is set to a level that is required for the CMOS logic circuit to operate.

The leakage current during a standby state is suppressed as set forth in the following by virtue of block current control transistors N101 and P101.

In an active period from time t0 to time t1, activation signal Sav attains an active state (L level), and transistors P201 and N201 both attain a conductive state.

Therefore, the power supply current required for operation is supplied to CMOS logic circuit 120.

At time t1 when activation signal Sav is driven to an inactive state (H level), transistors N201 and P201 both attain a non-conductive state.

Therefore, the value of the current supplied to node E is controlled by block current control transistor P101. The value of the current flowing out from node F is controlled by block current control transistor N101.

When leakage current flows to CMOS logic circuit 120 in a standby state, the potential of node E becomes lower than the level of power supply potential Vcc due to the voltage drop by transistor P101. The potential of node F becomes higher than the level of ground potential GND.

Thus, similar to semiconductor integrated circuit device 100 of the first embodiment, the gate potential of a P channel MOS transistor charging an output node is biased relatively positive with respect to the source in each logic gate forming the CMOS circuit. In contrast, the gate potential of an N channel MOS transistor for discharging the output node is biased relatively negative with respect to the source.

In other words, the transistors forming each CMOS logic gate are biased in a self-matching manner in a direction where leakage current is reduced in response to generation of a leakage current.

More specifically, as shown in FIG. 6, it is assumed that the inputs of inverter 122 which is the first stage in CMOS logic circuit 120 and inverter 124 which is the second stage in CMOS logic circuit 120 attain an L level and an H level, respectively, in a standby state.

N channel MOS transistor N22 forming inverter 122 and P channel MOS transistor P33 forming inverter 124 are biased so as to attain a non-conductive state in a standby period.

When leakage current is generated in standby state, the potentials of node F and node B rise. Therefore, the source of transistor N22 is biased to a level higher than the ground potential level, and the gate biased to the L level of the ground potential is biased relatively negative with respect to the source.

The potential level of node C of P channel MOS transistor P33 attains a level lower than power supply potential Vcc corresponding to the voltage drop of transistors P101 and P31. Therefore, the gate of transistor P33 connected to node E via transistors P22 and stage current control transistor P21 attaining a conductive state is biased more positive than node C which is the source.

As described above in semiconductor integrated circuit device 200 of the second embodiment, the transistor of CMOS logic circuit 120 is self-biased in a self-matching manner in a direction where leakage current is reduced in response to generation of leakage current in a standby state. Therefore, increase in power consumption during a standby state can be suppressed.

Furthermore, a sufficient amount of operating current is applied to CMOS logic circuit 120 in an operating mode by virtue of a structure where limitation of power supply current by block current control means is removed by transistors P201 and N201.

[Modification of Second Embodiment]

Semiconductor integrated circuit device 200 of the second embodiment has a structure in which the gate potentials of the stage current control transistors and block current control transistors are directly controlled by gate potential control unit 146.

The gate potential of a stage current control transistor must be controlled to a level that can supply sufficient current to allow operation in an active state.

However, controlling a stage current control transistor to attain a gate potential level so as to reduce source-drain current is more effective for reducing leakage current in a standby state.

In semiconductor integrated circuit device 200 of the second embodiment, the leakage current in a standby state can further be reduced by a structure wherein the gate potentials of stage and block current control transistors are controlled by current control circuit 140 of semiconductor integrated circuit device 100 of the first embodiment.

Figure 8:
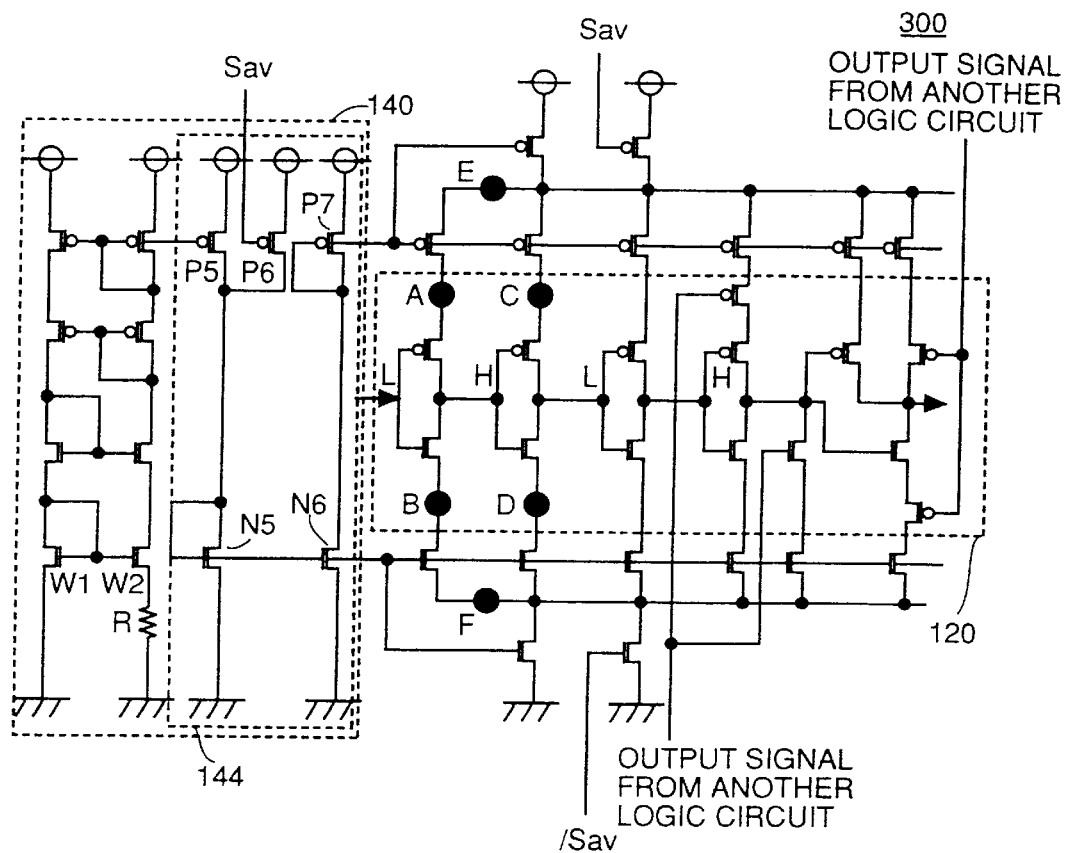
FIG. 8 is a circuit diagram showing components of an semiconductor integrated circuit device 300 which is a modification of the second embodiment.

FIG. 8 is a circuit diagram showing a structure of an semiconductor integrated circuit device 300 which is such a modification of semiconductor integrated circuit device 200.

According to the structure shown in FIG. 8, the current controlled by stage current control transistors such as P21, P31, N21 and N31 can be further lowered than that in semiconductor integrated circuit device 200 in a standby period.

More specifically, in a standby state, transistor P6 in current control circuit 140 is rendered non-conductive in response to activation signal Sav attaining an H level, whereby the value of the current flowing through transistors N6 and P7 is reduced.

When activation signal Sav attains an L level in an active state, transistor P6 conducts, so that the value of the current flowing through transistors P7 and N6 of gate potential control unit 144 increases. This results in increase in the current flowing through stage current control transistors P21, P31, N21 and N31. The current control operation of block current control transistors P101 and N101 is suppressed since transistors P201 and N201 conduct.

Thus, a sufficient amount of operating current can be supplied to CMOS logic circuit 120 in an operating period.

Figure 9:
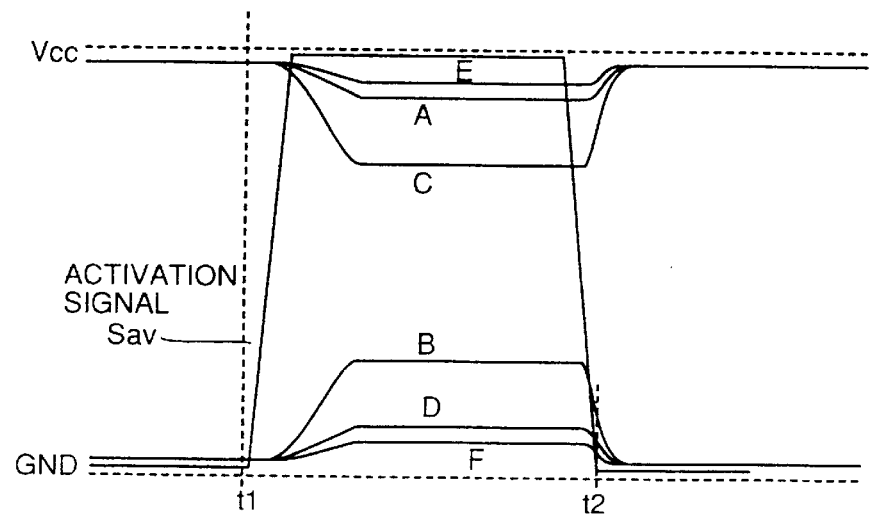
FIG. 9 is a timing chart or describing an operation of semiconductor integrated circuit device 300.

FIG. 9 is a timing chart for describing the operation of semiconductor integrated circuit device 300 of FIG. 8.

The operation thereof is similar to that of semiconductor integrated circuit device 200 shown in FIG. 7, provided that the amount of voltage drop in the stage current control transistor and block current control transistor at occurrence of leakage current is increased in response to reduction of the value of the current controlled by stage current control transistors P21, P31, N21, and N31 in a standby state.

When there is leakage current, the self biased effect of the gate-source voltage of the transistor forming a logic gate is enhanced to result in further reduction of leakage current. More specifically, subsequent to time t1, the potential level of the source of transistor N22 having an L gate potential, i.e. of node B, is higher than that of FIG. 7 in a standby state. Therefore, the gate potential of N channel MOS transistor N22 forming inverter 122 is biased relatively negative with respect to the source potential. As a result, the leakage current is further reduced.

The same applies for a P channel MOS transistor P33 that is biased so as to attain a cut off state in a standby mode.

Third Embodiment

Figure 10:
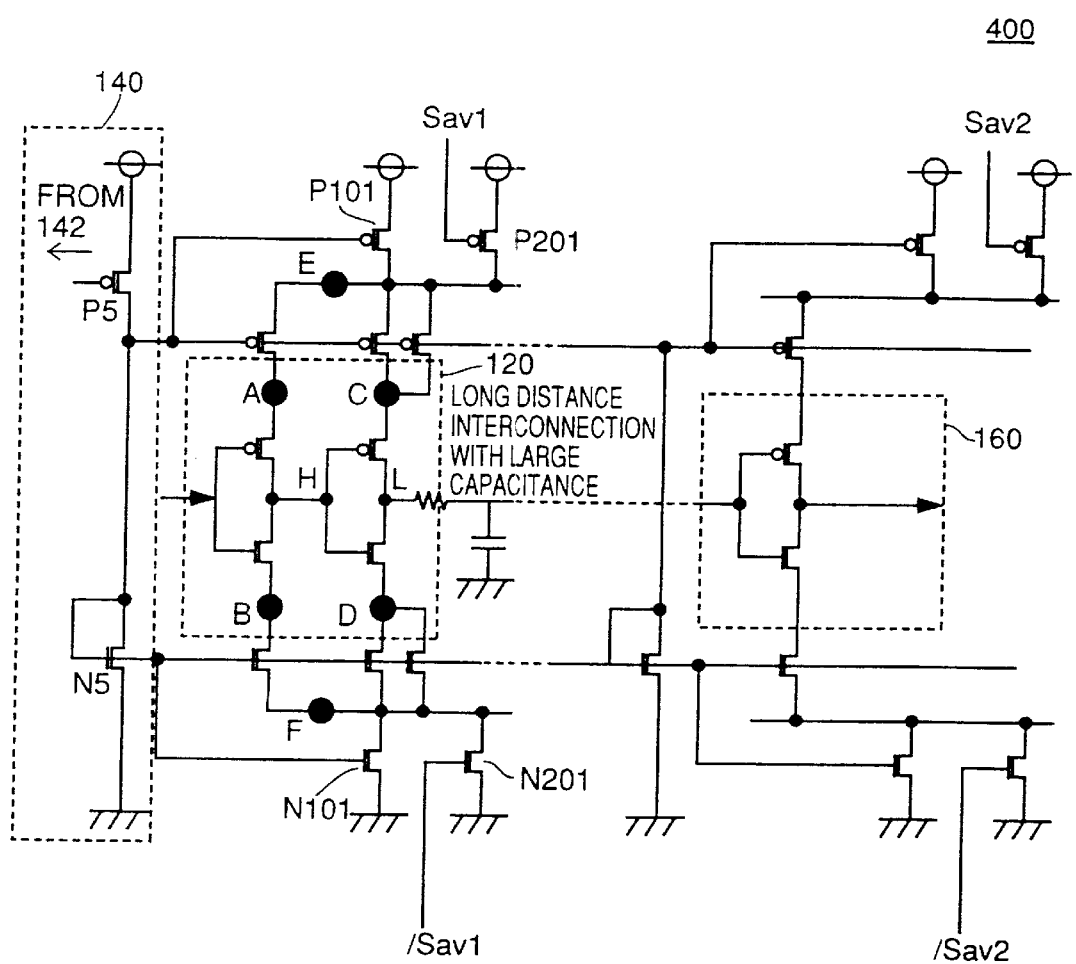
FIG. 10 is a circuit diagram showing main components of an semiconductor integrated circuit device 400 according to a third embodiment of the present invention.

FIG. 10 is a block diagram schematically showing a structure of an semiconductor integrated circuit device 4 100 according to a third embodiment of the present invention. Semiconductor integrated circuit device 400 of the third embodiment differs from semiconductor integrated circuit device 200 of FIG. 6 or semiconductor integrated circuit device 300 of FIG. 8 in that a plurality of CMOS logic circuits are provided in which the value of the current supplied from a constant current control circuit is controlled.

Each of the plurality of these CMOS logic circuits is controlled by a different activation signal.

FIG. 10 shows an example where two CMOS logic circuits 120 and 160 are present.

CMOS logic circuit 120 has the value of the current supplied from the power source limited according to control of the gate potential of a block current control transistor and a stage current control transistor by constant current control circuit 140. Similar to the structure of semiconductor integrated circuit device 200 shown in FIG. 6, the operation of block current control transistors P101 and N101 corresponding to CMOS logic circuit 120 for controlling supply current is suppressed by P channel MOS transistor P201 and N channel MOS transistor N201 rendered conductive in response to activation of an activation signal Sav1.

More specifically, CMOS logic circuit 120 is not subjected to limitation of a supply current from a block current control transistor, and operates only under limitation of current by a stage current control transistor in an active period.

In this case, as described in the second embodiment, current control circuit 140 can be implemented so that the value of the current limited by a stage current control transistor is controlled to a level where sufficient operation can be ensured.

It is also possible to provide a structure wherein the value of the current flowing to the stage current control transistor is variable in an active state and a standby state, as shown in FIG. 8.

Similarly, CMOS logic circuit 160 that operates upon receiving an output of CMOS logic circuit 120 has a structure in which the value of the current supplied from a stage current control transistor and a block control current control transistor controlled by current control circuit 140 is controlled. CMOS logic circuit 160 has the current control operation of block current control transistors P102 and N102 suppressed to allow a sufficient amount of power supply current in response to an activation signal Sav2 attaining an active state (L level).

When a plurality of CMOS logic circuits are present in an semiconductor integrated circuit device formed on the same semiconductor substrate, not always all these CMOS logic circuits operate simultaneously. In general, a CMOS logic circuit block operates according to an operation result of a CMOS logic circuit block of a preceding stage.

Therefore, each of the plurality of CMOS logic circuit blocks does not have to attain an active state constantly, and can be rendered active according to a corresponding activation signal only when required to be operated.

According to the above-described structure, a further reduction of power consumption is achieved since power consumption can be reduced during an active operation and leakage current in a CMOS logic circuit attaining a standby state can be reduced as described in the first and second embodiments.

As shown in FIG. 10, the interconnection through which data between each CMOS logic circuit is transferred has parasitic resistance and capacitance intentionally or not intentionally. Therefore, there is a predetermined time of delay from determination of a logic operation result of one CMOS logic circuit block to the operation of the next CMOS logic circuit block. The CMOS logic circuit block of the succeeding stage can be rendered active during this time delay.

Figure 11:
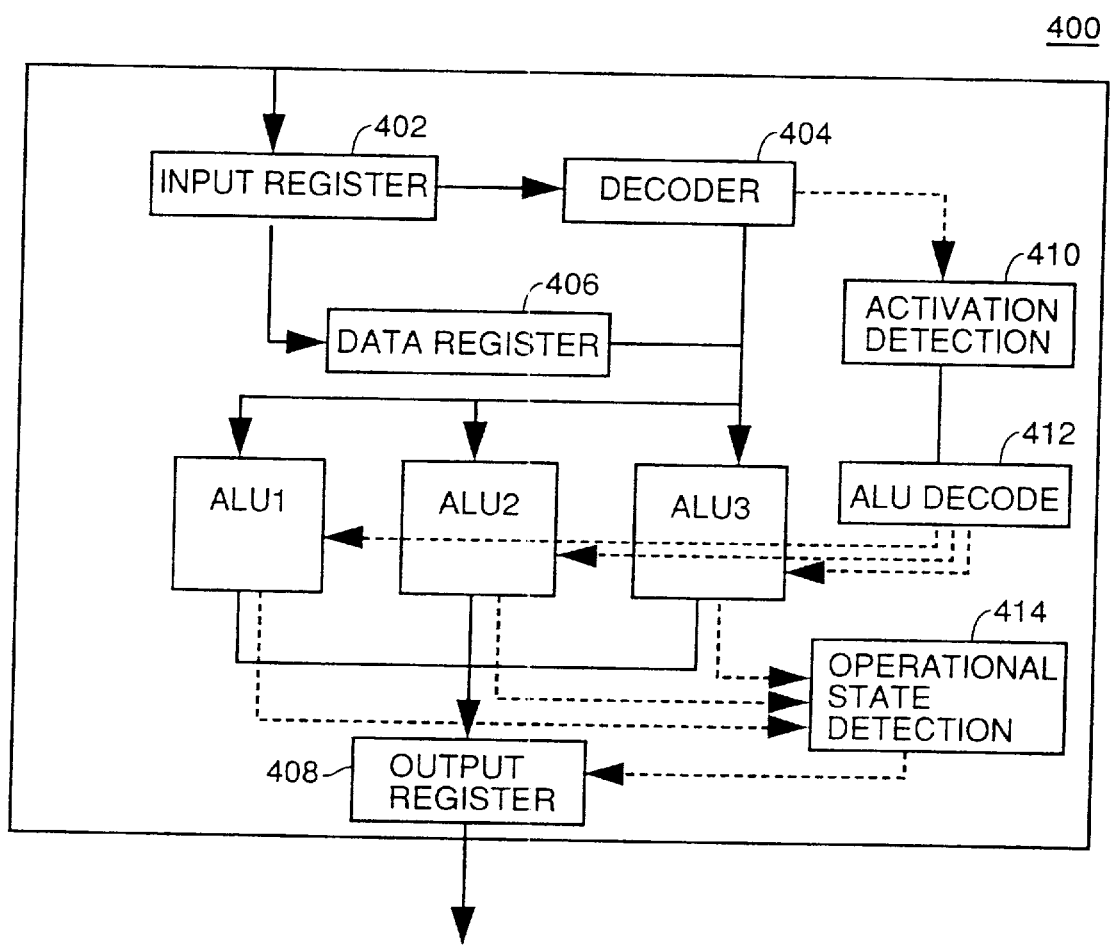
FIG. 11 is a block diagram schematically showing an entire structure of semiconductor integrated circuit device 400.

FIG. 11 is a block diagram schematically showing the entire structure of an semiconductor integrated circuit device 400 including such plurality of CMOS logic circuit blocks.

Referring to FIG. 11, semiconductor integrated circuit device 400 includes an input register 402 for temporarily holding externally applied data, a decoder 404 receiving data from input register 402 for decoding an externally applied instruction, a data register 406 receiving the temporarily held data of input register 402 and storing the same, arithmetic logic circuits ALU1, ALU2, and ALU3 receiving data from data register 406 and carrying out a predetermined operation according to an instruction from decoder 404, and an output register 408 receiving outputs from arithmetic logic circuits ALU1–ALU3 for temporarily holding the operation result to be output outside.

Semiconductor integrated circuit device 400 further includes an activation detection circuit 410 receiving an output from decoder 404 for detecting input of an external control signal, an ALU decode circuit 412 responsive to an activation detection result of activation detection circuit 410 for providing a signal that activates only a selected arithmetic logic circuit out of arithmetic logic circuits ALU1–ALU3, and an operational state detection circuit 414 receiving outputs from arithmetic logic circuits ALU1–ALU3 for detecting an end of an arithmetic operation of an arithmetic logic circuit.

Output register 408 is activated in response to an output of operational state detection circuit 414.

The operation of semiconductor integrated circuit device 400 will be described briefly hereinafter.

When data is input, input register 412 temporarily holds this data. Decoder 404 receives data from input register 402 to decode a control signal. Data register 406 receives an output from input register 402 to provide the input data to corresponding arithmetic logic circuits ALU1–ALU3. An instructed predetermined operation is carried out by selected arithmetic logic circuits ALU1–ALU3 according to a control signal from decoder 404. Then, an arithmetic result is provided to output register 408.

During the period when the input data is decoded by decoder 404, arithmetic logic circuits ALU1–ALU3 and output register 408 do not have to be operated. During this decoding period, arithmetic logic circuits ALU1–ALU3 and also output register 408 are rendered non-conductive.

When activation detection circuit 410 detects a data input according to a control signal from decoder 404, selected arithmetic logic circuits ALU1–ALU3 carry out a predetermined operation on the data applied from data register 406. Here, input register 412 attains a standby state. When operational state detection circuit 414 detects termination of a predetermined operation according to a signal from arithmetic logic circuits ALU1–ALU3, output register 408 is activated to provide outside the data from the arithmetic logic circuit.

Each arithmetic logic circuit can be set at a standby state during activation of output register 408. Therefore, only the logic circuit receiving and processing data operates, and the remaining logic circuit blocks attain a standby state. Since the leakage current in a standby state is suppressed, power consumption of semiconductor integrated circuit device 400 in a standby state is reduced.

Figure 12:
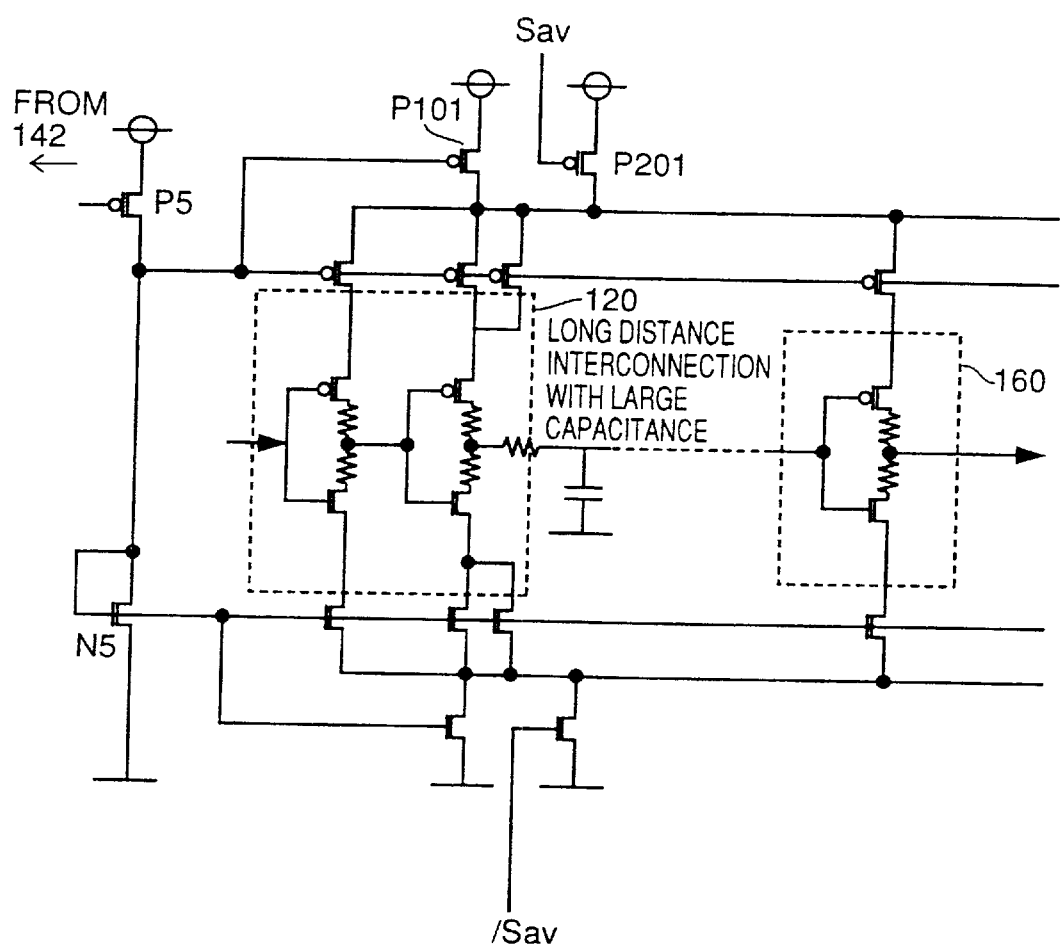
FIG. 12 is a circuit diagram showing components of an semiconductor integrated circuit device 500 which is a modification of the third embodiment.

FIG. 12 is a circuit diagram showing a modification of semiconductor integrated circuit device 400 of the third embodiment.

In an semiconductor integrated circuit device 500 according to a modification of the third embodiment, each logic gate has a first register disposed between an output node and a P channel MOS transistor functioning to charge the output node, and a second resistor disposed between the output node and an n channel MOS transistor serving to discharge the output node.

By the above-described arrangement of resistors, a predetermined potential difference can be set for the potential change between the drain node of each transistor and the output node. Therefore, the through current of each logic gate can be reduced.

Furthermore, similar to the description of semiconductor integrated circuit device 100 of the first embodiment, the presence of these resistors provide the advantage that the effect of suppressing leakage current in a standby state is enhanced. Therefore, the self bias effect of the transistor forming a logic gate is enhanced by the presence of these resistors.

Fourth Embodiment

Figure 13:
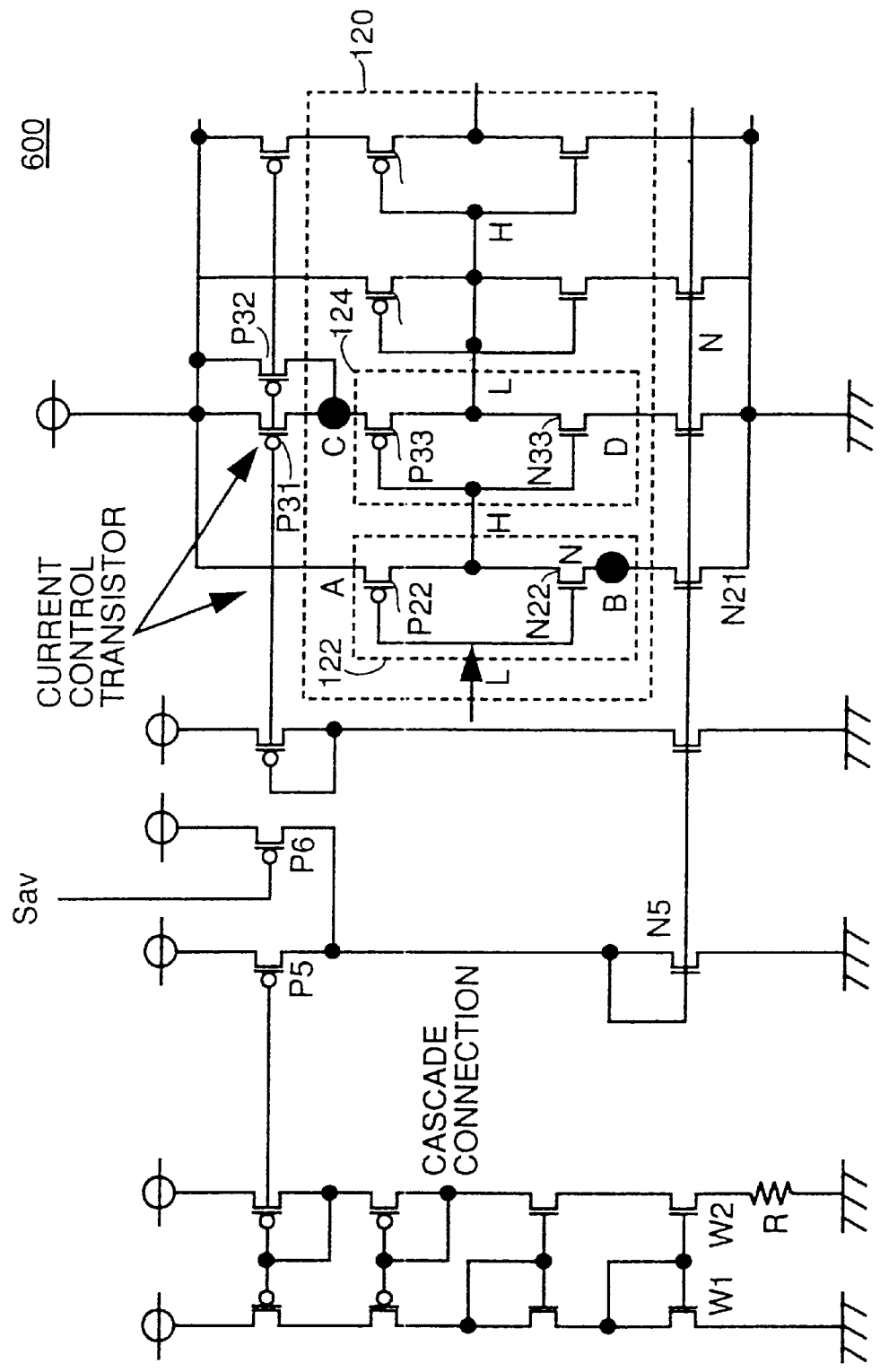
FIG. 13 is a circuit diagram showing main components of an semiconductor integrated circuit device 600 according to a fourth embodiment of the present invention.

FIG. 13 is a circuit diagram showing a structure of an semiconductor integrated circuit device 600 according to a fourth embodiment of the present invention.

The structure of semiconductor integrated circuit device 600 of the fourth embodiment differs from the structure of semiconductor integrated circuit device of the first embodiment in that the input level of each logic gate is defined in a one-to-correspondence in a standby-state.

Accordingly, semiconductor integrated circuit device 600 has a structure in which a stage current control transistor is disposed only at the side of the transistor biased so as to attain a cut off state in a standby mode.

More specifically, it is assumed that the input of inverter 122 of the first stage in CMOS logic circuit 120, for example, is always fixed to an L level in a standby state. In this case, the transistor attaining a cut off state out of the transistors forming inverter 122 is N channel MOS transistor N22. Therefore, leakage current is mainly caused by reduction in the threshold voltage of this transistor N22. A structure is implemented in which a stage current control register N21 is disposed between the source of transistor N22 and ground potential GND. Similarly, in inverter circuit 124 having an input node fixed to an H level in a standby state, stage current control transistors such as transistors P31 and P32 are arranged between the source of P channel MOS transistor P33 and power supply potential Vcc.

Figure 14:
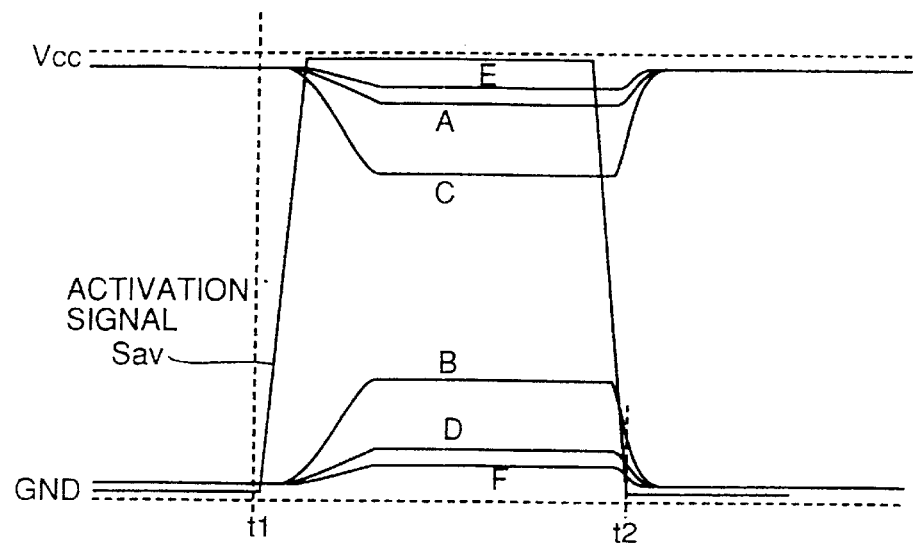
FIG. 14 is a timing chart for describing an operation of semiconductor integrated circuit device 600.

FIG. 14 is a timing chart for describing an operation of semiconductor integrated circuit device 600 shown in FIG. 13.

In response to activation signal Sav rendered non-conductive at time t1, CMOS logic circuit 120 attains a standby state. Here, the potential of node A is maintained at power supply potential Vcc in inverter 122. In contrast, the potential level of the source of N channel MOS transistor N22, i.e. of node B, is raised towards the plus side due to a voltage drop by stage current control transistor N21.

Therefore, similar to semiconductor integrated circuit device 100 of the first embodiment, the leakage current flowing via inverter 122 is reduced. The same applies for inverter 124. More specifically, the source of transistor N33 forming inverter 124, i.e. node D is fixed at the level of ground potential GND also in a standby state. In contrast, the potential of the source of P channel MOS transistor P33, i.e. the potential of node C, becomes lower than power supply potential Vcc due to the voltage drop by stage current control transistors P31 and P32. Therefore, leakage current flowing via P channel MOS transistor P33 is suppressed.

When the input level of each logic gate of a CMOS logic circuit is defined in a one-to-one correspondence in a standby state, leakage current can be suppressed to allow reduction in power consumption by providing either one of the stage current control transistors.

Fifth Embodiment

Figure 15:
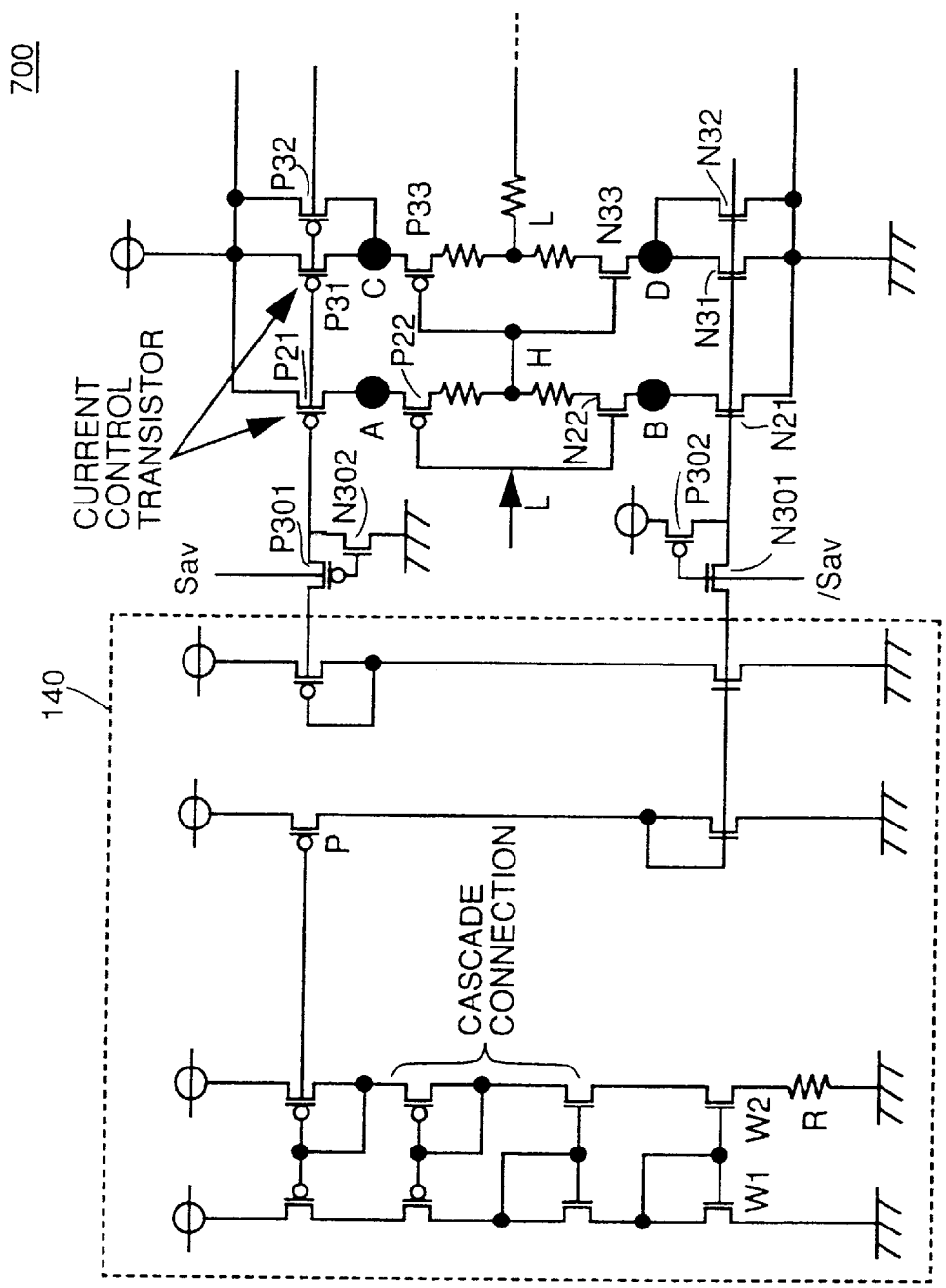
FIG. 15 is a circuit diagram showing main components of an semiconductor integrated circuit device 700 according to a fifth embodiment of the present invention.

FIG. 15 is a circuit diagram showing a structure of an semiconductor integrated circuit device 700 according to a fifth embodiment of the present invention.

The structure of semiconductor integrated circuit device 700 differs from the structure of semiconductor integrated circuit device 100 of the first embodiment in that transfer gates P301 and N301 are disposed between current control circuit 140 and a stage current control transistor. Transfer gates P301 and N301 are controlled by activation signal Sav to be rendered non-conductive in an active state.

The gate potential of a stage current control transistor (P channel MOS transistor) for controlling a current flow from a power source is coupled to ground potential by N channel MOS transistor N302 in an active state.

Similarly, a stage current control transistor (N channel MOS transistor) for controlling current flow towards ground potential is controlled so that its gate potential attains the level of power supply potential Vcc via transistor P302 in an active state.

According to the above-described structure, current control circuit 140 is control led in a standby state, and the control current value of each stage current control transistor is determined. At the time of activation, each stage current control transistor completely conducts to allow a sufficient amount of power supply current to CMOS logic circuit 120.

According to the above-described structure, a CMOS logic circuit can be implemented that has low leakage current, i.e. small power consumption, even when power supply voltage is lowered.

As a fixed potential for setting a stage current control transistor at a conductive state, a structure can be implemented in which, not only ground potential is set for a P channel MOS transistor as shown in FIG. 15, but also in which a potential of a further negative side is set. Similarly, a structure may be implemented in which a potential higher than power supply potential Vcc (boosted potential) is set for an N channel MOS transistor. According to such a structure, a sufficient amount of power supply current can be supplied to a CMOS logic circuit during activation.

Sixth Embodiment

Figure 16:
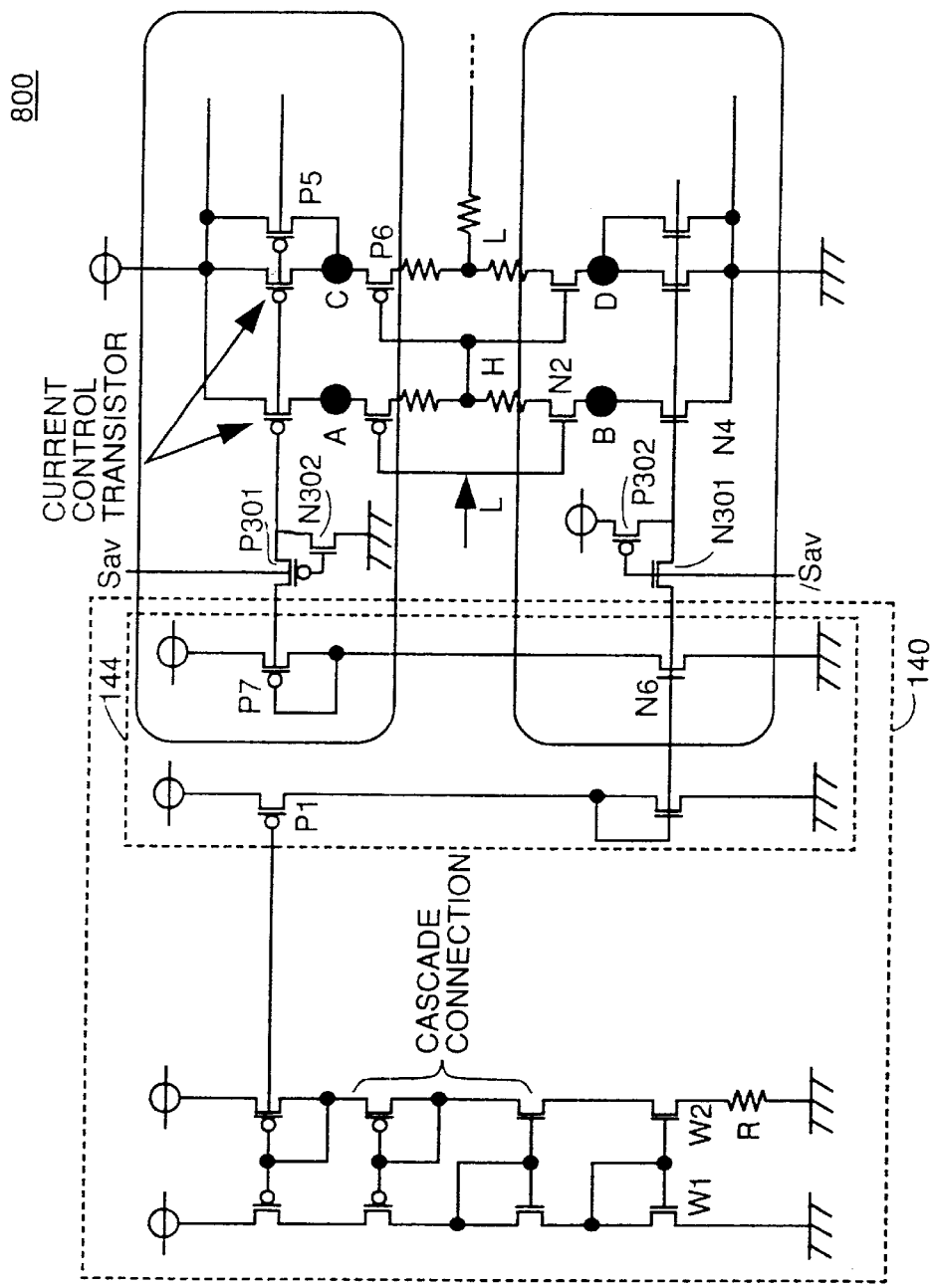
FIG. 16 is a circuit diagram showing main components of an semiconductor integrated circuit device 800 according to a sixth embodiment of the present invention.
Figure 18A:
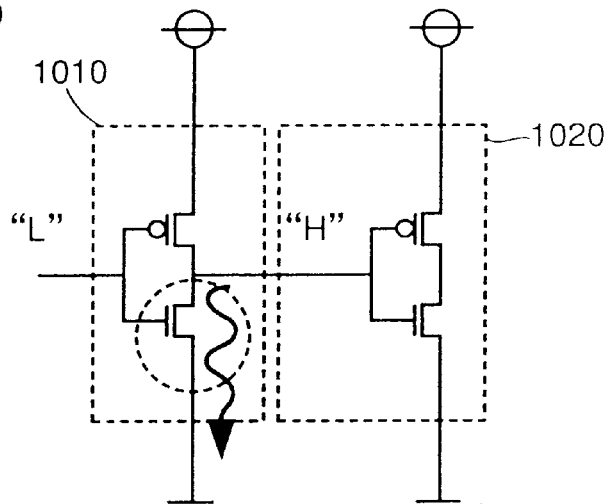
FIG. 18A is a circuit diagram showing main components of semiconductor integrated circuit device 1000.
Figure 18B:
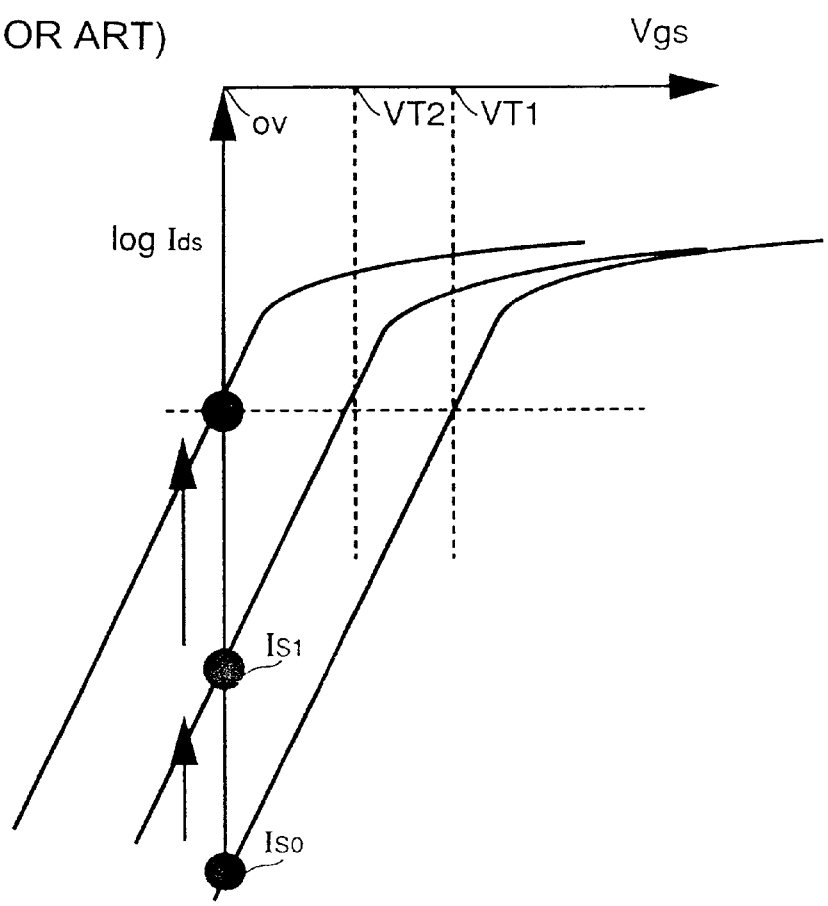
FIG. 18B is a diagram showing operating points of a transistor in leakage current occurrence for describing an operation of semiconductor integrated circuit device 1000 in leakage current reduction.

FIG. 16 is a circuit diagram showing a structure of an semiconductor integrated circuit device 800 according to a sixth embodiment of the present invention.

Semiconductor integrated circuit device 800 of the sixth embodiment differs in structure from semiconductor integrated circuit device 700 of FIG. 15 in the following points.

A stage current control transistor disposed at the power source side, and a P channel MOS transistor P7 and a transfer gate P301 in gate potential control unit 144 are formed in the same well. Similarly, a stage current control transistors disposed at the ground potential side (N channel MOS transistor), and an N channel MOS transistor N6 and a transfer gate N301 in gate potential control unit 144 are formed in the same well.

When leakage current is generated in a standby period to cause a rise in the potential of the ground node in the P well where an N channel MOS transistor, for example, is formed, the threshold value of each N channel MOS transistor is increased according to a back gate effect to reduce leakage current by virtue of the above-described structure.

The same applied for an N well in which a P channel MOS transistor is formed.

According to the structure shown in FIG. 16, generation of leakage current can further be suppressed even when power supply potential Vcc is lowered, and power consumption during a standby period of a CMOS logic circuit can be reduced.

Furthermore, a similar effect can be obtained in the second embodiment shown in FIG. 6 by forming the stage and block current control transistors and the transistor of the same conductivity type in a CMOS gate in the same well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a data input node for receiving digital data;
   an internal circuit including a plurality of logic gates for processing said digital data having at least a first and a second level;
   a data output node for outputting result data produced by said internal circuit;
   a first voltage supply source for supplying a first potential corresponding to said first level to a first node;
   second voltage supply source for supplying a second potential corresponding to said second level to said plurality of logic gates via a second node;
   a first common node;
   a first block current control circuit, coupled between said first node and said first common node, for controlling an amount of current flowing between said first common node and said first node depending on whether an activation signal for said internal circuit designates a non-operating state or an operating state;
   a plurality of first stage current control circuits, provided corresponding to said plurality of logic gates respectively, each of said first stage current control circuits being coupled between the corresponding logic gate and said first common node for controlling an amount of current flow into/from said corresponding logic gate in response to the level of a first operational current control signal, said plurality of first stage current control circuits being in common coupled to said first block current control circuit via said first common node; and
   operating current control means for limiting the amounts of current flow by controlling the level of said first operational current control signal during the non-operating state and setting the level of said first operational current control signal to render each of said first stage current control circuits conductive during the operating state.

2. The semiconductor integrated circuit device according to claim 1, wherein each of said logic gates comprises:
an input node and an output node;
a P channel MOS transistor provided so as to form a conduction path from said first node, and having a gate connected to said input node to said output node;
an N channel MOS transistor provided so as to form a conduction path from said output node to said second node, and having a gate connected to said input node; and
a first resistor connected between said output node and a drain of either one of said P and N channel MOS transistors.

3. The semiconductor integrated circuit device according to claim 1, wherein each of said first stage current control circuits includes a first MOS control transistor coupled between said corresponding logic gate and said first common node and having a gate receiving said first operational current control signal.

4. The semiconductor integrated circuit device according to claim 1, wherein each of said logic gates comprises:
an input node and an output node;
a first logic MOS transistor provided so as to form a conduction path from said first common node to said output node, and having a gate connected to said input node; and
a second logic MOS transistor provided so as to form a conduction path from said output node to said second node, and having a gate connected to said input node,
wherein each of said first stage current control circuit includes a first MOS control transistor sharing a first common source/drain region with said first logic MOS transistor of said corresponding logic gate.

5. The semiconductor integrated circuit device according to claim 3, wherein said first block current control circuit includes
a first MOS block control transistor, coupled between said first node and said first common node, having a gate of which potential is controlled by said operating current control means.

6. The semiconductor integrated circuit device according to claim 3,
said operating current control means comprises:
a first signal line, provided in common to said first stage current control circuits for transmitting said first operational current control signal;
signal level generating means for generating an internal signal having a level as high as that of said first operational current control signal in the non-operating state;
switch means, provided between said signal level generating means and said first signal line, for attaining a cut off state during the operating state and a conductive state during the non-operating state; and
potential setting means for setting the level of said first operational current control signal to render said first MOS control transistor conductive during the operating state.

7. The semiconductor integrate d circuit device according to claim 6, wherein each of said logic gates comprises:
an input node and an output node;
a first logic MOS transistor provided so as to form a conduction path from said first node to said output node, and having a gate connected to said input node; and a second logic MOS transistor provided so as to form a conduction path from said output node to said second node, and having a gate connected to said input node,
wherein said first logic MOS transistor is formed in a well where said first logic MOS transistor of said corresponding logic gate is built.

8. The semiconductor integrated circuit device according to claim 1, further comprising:
a second common node;
a second block current control circuit, coupled between said second node and said second common node, for controlling an amount of current flowing between said second common node and said second node depending on whether the activation signal for said internal circuit designates the non-operating state or the operating state; and
a plurality of second stage current control circuits, provided corresponding to said plurality of logic gates respectively, each of said second stage current control circuits being coupled between the corresponding logic gate and said second common node for controlling an amount of current flow into/from said corresponding logic gate in response to the level of a second operational current control signal, wherein
said operating current control means limits the amount of current flow by controlling the level of said second operational current control signal during the non-operating state and setting the level of said second operational current control signal to render each of said second stage current control circuits conductive during the operating state.

9. The semiconductor integrated circuit device according to claim 2, wherein each of said logic gates further comprises
a second resistor connected between said output node and a drain of the other of said P and N channel MOS transistors.

10. The semiconductor integrated circuit device according to claim 3, further comprising:
a second common node;
a second block current control circuit, coupled between said second node and said second common node, for controlling an amount of current flowing between said second common node and said second node depending on whether the activation signal for said internal circuit designates the non-operating state or the operating state; and
a plurality of second stage current control circuits, provided corresponding to said plurality of logic gates respectively, each of said second stage current control circuits being coupled between the corresponding logic gate and said second common node for controlling an amount of current flow into/from said corresponding logic gate in response to the level of a second operational current control signal,
wherein each of said second stage current control circuits includes a second MOS control transistor coupled between said corresponding logic gate and said second common node and having a gate receiving the second operational current control signal, and
said operating current control means limits the amount of current flow by controlling the level of said second operational current control signal during the non-operating state and setting the level of said second operational current control signal to render each of said second stage current control circuits conductive during the operating state.

11. The semiconductor integrated circuit device according to claim 4, further comprising:

a second common node;

a second block current control circuit, coupled between said second node and said second common node, for controlling an amount of current flowing between said second common node and said second node depending on whether the activation signal for said internal circuit designates the non-operating state or the operating state; and a plurality of second stage current control circuits, provided corresponding to said plurality of logic gates respectively, each of said second stage current control circuits in coupled between the corresponding logic gate and said second common node for controlling an amount of current flow into/from said corresponding logic gate in response to the level of a second operational current control signal, wherein said operating current control means limits the amount of current flow by controlling the level of said second operational current control signal during the non-operating state and setting the level of said second operational current control signal to render each of said second stage current control circuit conductive during the operating state, and each of said second stage current control circuits includes a second MOS control transistor sharing a second common source/drain region with said second logic MOS transistor of said corresponding logic gate.

12. The semiconductor integrated circuit device according to claim 5, wherein said operating current control means comprises:

signal level generating means for generating a constant current to produce an internal signal having a level as high as that of said first operational current control signal in the non-operating state; and potential setting means for controlling the level of said first operational current control signal based on said internal signal during the non-operating state and setting the level of said first operational current control signal to render said first MOS control transistor conductive during the operating state.

13. The semiconductor integrated circuit device according to claim 12, wherein said gate potential of said first MOS block control transistor is controlled based on said internal signal produced by said signal level generating means.

14. The semiconductor integrated circuit device according to claim 13, wherein said operating current control means further comprises a first signal line, provided in common to said first stage current control circuits for transmitting said first operational current control signal, and said gate of said first MOS block control transistor is coupled to said first signal line.

15. The semiconductor integrated circuit device according to claim 8, wherein each of said first stage current control circuits includes a first MOS control transistor having a gate receiving said first operational current control signal, each of said second stage current control circuits includes a second MOS control transistor having a gate receiving said second operational current control signal, said first block current control circuit includes a first MOS block control transistor, coupled between said first node and said first common node, having a gate of which potential is controlled by said operating current control means, and said second block current control circuit includes a second MOS block control transistor, coupled between said second node and said second common node, having a gate of which potential is controlled by said operating current control means.

16. The semiconductor integrated circuit device according to claim 15, wherein said operating current control means comprises:

signal level generating means for generating a constant current to produce first and second internal signals having levels as high as those of said first and second operational current control signals in the non-operating state, respectively; and potential setting means for controlling the levels of said first and second operational current control signals based on said first and second internal signals during the non-operating state and setting the levels of said first and second operational current control signals to render said first and second MOS control transistors conductive during the operating state.

17. The semiconductor integrated circuit device according to claim 15, wherein said operating current control means comprises:

a first signal line, provided in common to said first stage current control circuits for transmitting said first operational current control signal; and a second signal line, provided in common to said second stage current control circuits for transmitting said second operational current control signal, and said gate of said first MOS block control transistor is coupled to said first signal line and said gate of said second MOS block control transistor is coupled to said second signal line.

18. A semiconductor integrated circuit device comprising:

a data input node for receiving digital data;

an internal circuit including a plurality of logic gates for processing said digital data having at least a first level and a second level;

a data output node for outputting result data produced by said internal circuit;

a first voltage supply source for supplying a first potential corresponding to said first level to a first node;

a second voltage supply source for supplying a second potential corresponding to said second level to a second node;

a first common node;

a first block current control circuit, coupled between said first node and said first common node, for controlling an amount of current flowing between said first common node and said first node depending on whether an activation signal for said internal circuit designates a non-operating state or an operating state;

a plurality of first stage current control circuits, each provided between said first common node and a first corresponding logic gate of said logic gates that output said first level during the non-operating state for controlling an amount of current flowing between said first corresponding logic gate and said first common node in response to a first operational current control signal, said plurality of first stage current control circuits being in common coupled to said first block current control circuit via said first common node;

a second common node;

a second block current control circuit, coupled between said second node and said second common node, for controlling an amount of current flowing between said second common node and said second node depending on whether the activation signal for said internal circuit designates the non-operating state or the operating state;

a plurality of second stage current control circuits, each provided between said second common node and a second corresponding logic gate of said logic gates that output said second level during said non-operating state for controlling an amount of current flowing between said second corresponding logic gate and said second common node in response to a second operational current control signal, said plurality of second stage current control circuits being in common coupled to said second block current control circuit via said second common node; and operating current control means for limiting the amount of current flow by controlling the levels of said first and second operational current control signals during the non-operating state and setting the levels of said first and second operational current control signals to render said first and second stage current control circuits conductive during the operating state.

19. A semiconductor integrated circuit device comprising:

a plurality of internal circuit blocks for processing digital data having at least a first level and a second level, each of said internal circuit blocks including;
   a data input node for receiving said digital data;
   a plurality of logic gates; and
   a data output node for outputting result data produced by said internal circuit block;

control means for controlling an operation timing of each said internal circuit block;

a first voltage supply source for supplying a first potential corresponding to said first level;

a second voltage supply source for supplying a second potential corresponding to said second level;

a plurality of first common nodes provided corresponding to said internal circuit blocks respectively;

a plurality of first block current control circuits, each provided corresponding to one of said internal circuit blocks and coupled between said first voltage supply source and a corresponding one of said first common nodes for controlling an amount of current flow from said first voltage supply source to the corresponding internal circuit block depending on whether said corresponding internal circuit block is in a non-operating state or an operating state;

a plurality of second common nodes provided corresponding to said internal circuit blocks respectively;

a plurality of second block current control circuits, each provided corresponding to one of said internal circuit blocks and coupled between said second voltage supply source and a corresponding one of said second common nodes for controlling a amount of current flow from the corresponding internal circuit block to said second voltage supply source depending on whether said corresponding internal circuit block is in the non-operating state or the operating state;

a plurality of stage current control circuits, provided corresponding to said plurality of logic gates respectively, each of said stage current control circuits including a first component circuit coupled to either one of said first and second common nodes for controlling an amount of current flow into/from the corresponding logic gate in response to a level of one of a first operational current control signal and a second operational current control signal, at least two of said stage current control circuits being in common coupled to a corresponding one of said first or second block current control circuits via a corresponding one of said first or second common nodes, and operating current control means for limiting the amount of current flow by controlling the levels of said first and second operational current control signals during the non-operating state and setting the levels of said first and second operational current control signals to render said first component circuits conductive during an operating state.

20. The semiconductor integrated circuit device according to claim 19, wherein each of said logic gates comprises:
   an input node and an output node;
   a first logic MOS transistor provided so as to form a conduction path from said first voltage supply source to said output node, and having a gate connected to said input node; and
   a second logic MOS transistor provided so as to form a conduction path from said output node to said second voltage supply source, and having a gate connected to said input node, wherein
   each of said first component circuits which are coupled to said first common node includes a first MOS control transistor sharing a first common source/drain region with said first logic MOS transistor of said, corresponding logic gate, and
   each of said first component circuits which are coupled to said second common node includes a second MOS control transistor sharing a second common source/drain region with said second logic MOS transistor of said corresponding logic gate.

21. The semiconductor integrated circuit device according to claim 19, wherein each of said first component circuits which are coupled to said first common node includes a first MOS control transistor having a gate receiving said first operational current control signal, and
   each of said first component circuits which are coupled to said second common node includes a second MOS control transistor having a gate receiving said second operational current control signal,
   wherein said operating current control means comprises:
      signal level generating means for generating an internal signal having a level as high as that of either one of said first and second operational current control signals in the non-operating state; and
      potential setting means for controlling the levels of said first and second operational current control signals based on said internal signal during the non-operating state and setting the levels of said first and second operational current control signals to render said first and second MOS control transistors conductive during the operating state.

22. The semiconductor integrated circuit device according to claim 21, wherein each of said logic gates comprises:
   an input node and an output node;
   a first logic MOS transistor provided so as to form a conduction path from said first voltage supply source to said output node, and having a gate connected to said input node; and a second logic MOS transistor provided so as to form a conduction path from said output node to said second voltage supply source, and having a gate connected to said input node, wherein said first MOS control transistor shares a first common source/drain region with said first logic MOS transistor of said corresponding logic gate, and said second MOS control transistor shares a second common source/drain region with said second logic MOS transistor of said corresponding logic gate.

23. The semiconductor integrated circuit device according to claim 20, wherein each of said stage current control circuits further includes a second component circuit coupled between said corresponding logic gate and the other of said first and second common nodes for controlling the amount of current flow in response to a level of the other of the first operational current control signal and the second operational current control signal, wherein each of said second component circuits which are coupled to said first common node includes a third MOS control transistor sharing a third common source/drain region with said first logic MOS transistor of said corresponding logic gate, and wherein each of said second component circuits which are coupled to said second common node includes a fourth MOS control transistor sharing a fourth common source/drain region with said second logic MOS transistor of said corresponding logic gate.

24. The semiconductor integrated circuit device according to claim 21, wherein each of said stage current control circuits further includes a second component circuit coupled between said corresponding logic gate and the other of said first and second common nodes for controlling the amount of current flow in response to a level of the other of the first operational current control signal and the second operational current control signal, wherein each of said second component circuits which are coupled to said first common node includes a third MOS control transistor having a gate receiving said first operational current control signal, and wherein each of said second component circuits which are coupled to said second common node includes a fourth MOS control transistor having a gate receiving said second operational current control signal.

25. The semiconductor integrated circuit device according to claim 22, wherein each of said stage current control circuits further includes a second component circuit coupled between said corresponding logic gate and the other of said first and second common nodes for controlling the amount of current flow in response to a level of the other of the first operational current control signal and the second operational current control signal, wherein each of said second component circuits which are coupled to said first common node includes a third MOS control transistor sharing a third common source/drain region with said first logic MOS transistor of said corresponding logic gate, and wherein each of said second component circuits which are coupled to said second common node includes a fourth MOS control transistor sharing a fourth common source/drain region with said second logic MOS transistor of said corresponding logic gate.

26. A semiconductor integrated circuit device comprising:

a data input node for receiving digital data;

an internal circuit including a plurality of logic gates for processing said digital data having at least a first level and a second levels;

a data output node for outputting result data produced by said internal circuit;

a first voltage supply source for supplying a first potential corresponding to said first level to a first node;

a second voltage supply source for supplying a second potential corresponding to said second level to a second node;

a first common node;

a first block current control circuit provided between said first node and said first common node for controlling an amount of current flow from said first voltage supply source depending on whether an activation signal for said internal circuit designates a non-operating state or an operating state;

a plurality of first stage current control circuits, provided corresponding to said plurality of logic gates respectively, each of said first stage current control circuits being coupled between the corresponding logic gate and said first common node for controlling an amount of current flow from said first voltage supply source in response to a level of a first operational current control signal, said plurality of first stage current control circuits being in common coupled to said first block current control circuit via said first common node;

a second common node;

a second block current control circuit provided between said second node and said second common node for controlling an amount of current flow to said second node depending on whether said activation signal for said internal circuit designates the non-operating state or the operating state;

a plurality of second stage current control circuits, provided corresponding to said plurality of logic gates respectively, each of said second stage current control circuit being coupled between said corresponding logic gate and said second common node for controlling an amount of current flow towards said second voltage supply source in response to a level of a second operational current control signal, said plurality of second stage current control circuits being in common coupled to said second block current control circuit via said second common node;

a first signal line, provided in common to said plurality of first stage current control circuits, for transmitting said first operational current control signal;

a second signal line, provided in common to said plurality of second stage current control circuits, for transmitting said second operational current control signal; and operating current control means for limiting the amounts of current flow by controlling the levels of said first and second operational current control signals during the non-operating state and setting the levels of said first and second operational current control signals to render said first and second stage current control circuits conductive during the operating state.

27. The semiconductor integrated circuit device according to claim 26, wherein each of said logic gates comprises:

an input node and an output node;

a first logic MOS transistor provided so as to form a conduction path from said first node to said output node, and having a gate connected to said input node; and a second logic MOS transistor provided so as to form a conduction path from said output node to said second node, and having a gate connected to said input node, wherein each of said first stage current control circuits includes a first MOS control transistor sharing a first common source/drain region with said first logic MOS transistor of said corresponding logic gate, and each of said second stage current control circuits includes a second MOS control transistor sharing a second common source/drain region with said second logic MOS transistor of said corresponding logic gate.

28. The semiconductor integrated circuit device according to claim 26, wherein said first block current control circuit includes;

first switch means, provided between said first common node and said first voltage supply source, for attaining a conductive state during the operating state of said internal circuit; and a first MOS block control transistor, coupled between said first common node and said first voltage supply source, having a gate receiving said first operational current control signal, and said second block current control circuit includes:

second switch means provided between said second common node and said second voltage supply source, for attaining a conductive state during the operating state of said internal circuit; and a second MOS block control transistor, coupled between said second common node and said second voltage supply source, having a gate receiving said second operational current control signal.

* * * * *